(12) United States Patent
Kawasaki

(10) Patent No.: US 7,417,693 B2
(45) Date of Patent: Aug. 26, 2008

(54) LIQUID CRYSTAL DISPLAY DEVICE AND ITS MANUFACTURING METHOD

(75) Inventor: Kiyohiro Kawasaki, Osaka (JP)

(73) Assignee: A U Optronics Corp., Hsinchu (TW)

( * ) Notice: Subject to any disclaimer, the term of this patent is extended or adjusted under 35 U.S.C. 154(b) by 499 days.

(21) Appl. No.: 11/090,288

(22) Filed: Mar. 28, 2005

(65) Prior Publication Data

US 2005/0212985 A1    Sep. 29, 2005

(30) Foreign Application Priority Data

Mar. 29, 2004    (JP)    ............................. 2004-093945

(51) Int. Cl.
G02F 1/136    (2006.01)

(52) U.S. Cl. ........................... 349/43; 349/187; 349/38; 349/140

(58) Field of Classification Search ................... 349/43, 349/138, 139, 143, 46, 187, 38, 42, 106, 349/140, 152

See application file for complete search history.

(56) References Cited

U.S. PATENT DOCUMENTS

2002/0186330 A1 *  12/2002  Kawasaki ..................... 349/43

* cited by examiner

Primary Examiner—Thoi V Duong
(74) Attorney, Agent, or Firm—Bacon & Thomas, PLLC

(57) ABSTRACT

In a conventional manufacturing process where the number of manufacturing processes is reduced to form a semiconductor layer of a channel etch-type insulating gate-type transistor and source-drain wires in one photographic etching processing using half-tone exposure technology, the manufacturing margin is narrow, lowering the yield if the distance between the source and the drain wire shortens.

A 4-mask process proposal needless of half-tone exposure technology is constructed by streamlining the formation of scan lines and pseudo-pixel electrodes at the same time, both comprising a laminate of a transparent conductive layer and a metal layer, and the formation of the transparent conductive pixel electrodes through removing the metal layers on the pseudo-pixel electrodes at the time of the formation of the opening in the passivation insulating layer, as well as by reducing the formation process of the opening through removing a gate insulating layer also at the formation of semiconductor layers for channel-etch type insulating gate transistors.

10 Claims, 15 Drawing Sheets

LIQUID CRYSTAL DISPLAY DEVICE AND ITS MANUFACTURING METHOD

BACKGROUND OF THE INVENTION

1. Field of the Invention

The present invention relates to a liquid crystal display device with a color image display function, and in particular to an active-type liquid crystal display device.

2. Description of Related Art

Televisions and various other image display devices which have a liquid crystal display of 5 to 75 cm in diagonal length are commercially available in mass quantity through the progress in recent years in micro-fabrication, liquid crystal material, high-density packaging technology, and other such technologies. In addition, color displays can easily be obtained by forming an RGB color layer on one of the two glass substrates composing the liquid crystal panel. In particular, in a so-called active liquid crystal panel with a switching element inside each pixel, there is little cross-talk, the response rate is high, and images with a high contrast ratio are guaranteed.

For these liquid crystal displays (liquid crystal panels), the matrix organization generally comprises around from 200 to 1200 scan lines and 300 to 1600 signal lines, but recently increases in screen size and definition are progressing simultaneously in response to the increase in display capacity.

FIG. 9 shows a state of liquid crystal panel mounting in which electric signals are provided to an image display part using packaging means such as COG (Chip-On-Glass) in which a conductive adhesive is used to connect a semiconductor integrated-circuit chip 3 for supplying a drive signal to electrode terminals 5 for scan lines formed on one of the transparent insulating substrates composing a liquid crystal panel 1, for example a glass substrate 2, or TCP (Tape-Carrier-Package) for fixing a TCP film 4, to electrode terminals 6 for signal lines using pressure and a suitable adhesive including a conductive medium using, for example, a thin polyimide-base plastic film with a copper foil terminals plated with gold or solder as a base. Herein, both of these mounting methods are shown at the same time for convenience, but in actual practice, either method may be arbitrarily selected.

Wire paths connecting the interval between the pixels in the image display area positioned nearly in the center of a liquid crystal panel 1 and electrode terminals 5 and 6 for scan lines and signal lines are 7 and 8, and do not necessarily need to be constructed of the same conductive material as the electrode terminals 5 and 6. 9 is a color filter or an opposing glass that is another transparent insulating substrate having transparent conductive opposing electrodes on its opposing side, which is common to all the liquid crystal cells.

FIG. 10 shows an equivalent circuit of an active-type liquid crystal display device with an insulating gate-type transistor 10 disposed as a switching element at each pixel. In the figure, 11 (7 in FIG. 9) is a scan line, 12 (8 in FIG. 9) is a signal line, 13 is a liquid crystal cell, and the liquid crystal cell 13 is treated as a capacitance element electrically. The elements drawn with solid lines are formed on the glass substrate 2, one of the glass substrates composing the liquid crystal panel, and opposing electrode 14 drawn with dotted lines common to all the liquid crystal cells 13 is formed on the main surface opposite the other glass substrate 9. If the "off" resistance of the insulating gate-type transistor 10 or the resistance of the liquid crystal cell 13 is low, or if gradation in the displayed image is to be emphasized, circuitry means may be introduced such as adding an auxiliary storage capacitor 15 in parallel with the liquid crystal 13 as a load to increase the time constant thereof. 16 is a storage capacitor line forming a mother line common to the storage capacitors 15.

FIG. 11 shows a cross-sectional view of the essential part of an image display part of a liquid crystal display device. The two glass substrates 2 and 9 composing the liquid crystal panel 1 are formed separated by a specified distance of several μm by a spacer material (not illustrated) such as pillar-shaped resin spacers formed on a color filter 9, plastic fibers, or plastic beads, and that gap is a closed spaced sealed by a sealing material and an end-sealing material made from an organic resin (neither of which are illustrated) at the periphery of the glass substrate 9, and the gap is filled with liquid crystal 17.

To obtain a color display, a thin organic film about 1 to 2 μm thick including either a dye or pigment or both called a color layer 18 is deposited on the closed space side of the glass substrate 9, providing a color display function, in which case the glass substrate 9 may also be referred to by the name a color filter (abbreviated as CF). Depending on the property of the liquid crystal material 17, a polarization plate 19 is attached to the top of the glass substrate 9 or the bottom of the glass substrate 2 or both, so the liquid crystal panel 1 functions as an electro-optical element. TN (Twisted-Nematic)-type liquid crystal material is currently used in most liquid crystal panels available commercially, and two polarization plates 19 are normally required. Although not illustrated, a back light source is disposed as a light source in the transmission-type liquid crystal panel, irradiating white light from below.

A thin polyimide-type resin film 20 about 0.1 μm thick, for example, formed on the two glass substrates 2 and 9 and in contact with the liquid crystal 17 is an alignment film for orientating liquid crystal molecules in a fixed direction. 21 is a drain electrode (wire) for connecting a drain of the insulating gate-type transistor 10 and a transparent conductive pixel electrode 22, and is often formed at the same time as a signal line (source line) 12. A semiconductor layer 23 is positioned between the signal line 12 and the drain electrode 21 and is described in further detail below. A thin Cr film layer 24 about 0.1 μm thick formed at the interface of the adjacent color layer 18 on the a color filter 9 is a light shield material for preventing external light from radiating on the semiconductor layer 23, the scan line 11, or the signal line 12. This is an established technology referred to as black matrix (abbreviated as BM).

Here, a description is given of the structure of an insulating gate-type transistor as a switching element and its manufacturing method. Two types of insulating gate-type transistors are currently used commonly, one of which will be introduced as a prior art example and be referred to as an etch-stop type. FIG. 12 is a plan view of a unit pixel of an active substrate (semiconductor devices for display devices) composing a conventional liquid crystal panel. Cross-section views of lines A-A', B-B' and C-C' in FIG. 12(e) are shown in FIG. 13. The manufacturing process thereof is described briefly below.

First, a first metal layer about 0.1 to 0.3 μm thick is deposited over the main surface of a glass substrate 2, product name 1737 manufactured by Corning, Incorporated, for example, about 0.5 to 1.1 mm thick as an insulating substrate with high transparency, chemical-resistance, and heat-resistance, and scan lines doubling as gate electrodes 11A and storage capacitor lines 16 are selectively formed using photosensitive resin patterns with micro-fabrication technology as shown in FIG. 12(a) and FIG. 13(a). The material for the scan line may be selected taking into consideration the combined properties of heat-resistance, chemical-resistance, hydrofluoric acid resistance, and conductance, though a metal with a high heat-resistance such as a Cr, Ta and an alloy thereof such as MoW is generally used.

While using Al (aluminum) as the material for the scan lines is reasonable for lowering the resistance value of the scan lines in response to the larger screens and higher definitions of liquid crystal panels, by itself, Al has a low heat-resistance, so adding an oxide layer (Al2O3) in anodization of the Al surface or laminating with Cr, Ta or Mo or a silicide thereof which are the said heat-resistance metals is currently the general technology in use. In other words, the scan lines 11 are constructed of one or more metal layers.

Next, a PCVD (plasma CVD) equipment is used to successively deposit three thin film layers about 0.3, 0.05, and 0.1 μm thick, for example, comprising a first SiNx (silicon nitride) layer 30 composing a gate insulating layer, a first amorphous silicon (a-Si) layer 31 composing a channel for an insulating gate-type transistor including almost no impurities, and a second SiNx layer 32 composing an insulating layer for protecting the channel, over the entire surface of the glass substrate 2, and micro-fabrication technology is used to selectively leave the second SiNx layer above the gate electrodes 11A narrower than the gate electrode 11A to form protection layers 32D as shown in FIG. 12(b) and FIG. 13(b), exposing the first amorphous silicon layer 31.

Continuing, the second amorphous silicon layer 33 including phosphorous, for example as an impurity, is deposited similarly about 0.05 μm thick, for example, over the entire surface using the PCVD equipment. Then, a thin film layer 34 of Ti, Cr, Mo, or the like, for example, is deposited as a heat-resistant metal layer about 0.1 μm thick, an Al thin film layer 35 about 0.3 μm thick is deposited as a low-resistance wiring layer, and a Ti thin film layer, for example, is deposited as an intermediate conductive layer about 0.1 μm thick. Drain electrodes 21 of insulating gate-type transistors comprising a laminate of these three thin film layers 34A, 35A, and 36A, which are source-drain wire materials, and signal lines 12 doubling as source electrodes are selectively formed with micro-fabrication technology using photosensitive resin patterns as shown in FIG. 12(c) and FIG. 13(c). This selective patterning is made by successively etching the Ti thin film layer 36, the Al thin film layer 35, and the Ti thin film layer 34 using the photosensitive resin patterns used in forming the source-drain wires as masks, and then removing the second amorphous silicon layer 33 between the source-drain electrodes 12 and 21 to expose the protective insulating layers 32D as well as removing the first amorphous silicon layer 31 in other regions to expose the gate insulating layer 30. Because the second SiNx layers 32D (protective insulating layers, etch-stop layers), which are layers for protecting the channels, are thus present, and the etching of the second amorphous silicon layer 33 automatically ends, this manufacturing method is called etch-stop.

Source-drain electrodes 12 and 21 are formed partly (a few μms) overlapped on a flat surface with protective insulating layers 32D so that the insulating gate type transistors do not form offset structures. This overlapping is better when small, for it works electrically as parasitic capacitance. However, its practical value is only about 2 μms for it is determined by the overlay accuracy of mask aligners (exposure equipments), the accuracy of photo-masks, the expansion coefficient of glass substrates, and the temperature of glass substrates during exposure.

Furthermore, after removing the said photosensitive resin patterns, a SiNx layer about 0.3 μm thick is deposited over the entire surface of the glass substrate 2 similarly to the gate insulating layer as a transparent insulating layer using the PCVD equipment to form a passivation insulating layer 37, the passivation insulating layer 37 is selectively removed using photosensitive resin patterns with micro-fabrication technology to form openings 62 on the drain electrodes 21 and openings 63 on the scan lines 11 and openings 64 on the signal lines 12 outside an image display area to expose the drain electrodes 21, part 5 of the scan lines 11 and part 6 of the signal lines 12, respectively as shown in FIG. 12(d) and FIG. 13(d). Openings 65 are similarly formed on the electrode patterns bundled and in parallel with the storage capacitor lines 16 to expose part thereof.

Finally, ITO (Indium-Tin-Oxide) or IZO (Indium-Zinc-Oxide), for example, is deposited as a transparent conductive layer about 0.1 to 0.2 μm thick using an SPT or other vacuum film-depositing equipment, and pixel electrodes 22 are selectively formed on the passivation insulating layer 37 containing the openings 62 using photosensitive resin patterns with micro-fabrication technology to complete the active substrate 2 as shown in FIG. 12(e) and FIG. 13(e). Part of the scan lines 11 exposed in the openings 63 may be used as the electrode terminals 5, and part of the signal lines 12 exposed in the openings 64 as the electrode terminals 6, and the electrode terminals 5A and 6A made from ITO on the passivation insulating layer 37 containing the openings 63 and 64 may be selectively formed as illustrated, but transparent conductive short lines 40 are ordinarily formed at the same time connected between the electrode terminals SA and 6A. The reason for this is so a high resistance can be made as a measure against static electricity by forming the interval between the electrode terminals 5A/6A and the short wires 40 into long-narrow striped forms to increase the resistance (not illustrated). Similarly, electrode terminals are formed on the storage capacitor lines 16 containing the openings 65, though a number thereof is not provided.

If wiring resistance of the signal wire 12 is not a problem, a low-resistance wire layer 35 made from Al is not necessarily required, in which case it is possible to simplify the layers of the source-drain wires 12 and 21 by selecting heat-resistant metal material such as Cr, Ta, or MoW. Ensuring an electrical connection with the second amorphous silicon layer using a heat-resistant metal layer is thus more important for the source-drain wires; the heat resistance of an insulating gate-type transistor is described in detail in Unexamined Patent Application Number H 7-74368 [i.e., 1995-74368] as an example of prior art. A region 50 (a right-slanting oblique portion) over which the storage capacitor line 16 and the drain electrode 21 are superimposed in a planar manner via the gate insulating layer 30 in FIG. 12(c) forms a storage capacitor 15, though a detailed description is omitted here.

A detailed history of the five-mask process described above is omitted, but it is obtained as the result of streamlining the semiconductor islanding processing and decreasing the number of contact-formation processes. Photo-masking, which initially required seven to eight times, has been reduced to the current five layers by the introduction of dry etching technology, which greatly contributes to the decreasing process costs. It is a well-known target of development that lowering the process cost in the manufacture of the active substrate and the material cost in the panel assembly and module packaging processes is effective in lowering the production costs of liquid crystal display devices. To lower process costs, either process may be eliminated to make the process shorter, or inexpensive process development or replacement to inexpensive process is available. Here, four-mask process resulting in an active substrate with four photo-masks is described as an example of eliminating processes. The photo-etching process is eliminated by introducing halftone exposure technology. FIG. 14 shows a plan view of a unit pixel in an active substrate corresponding to the four-mask process. The cross-section views of lines A-A', B-B' and C-C' in FIG. 14(e) are shown in FIG. 15. As already mentioned, two types of insulating gate-type transistors are commonly in use. Here, a channel etch-type insulating gate-type transistor is selected.

First, a first metal layer about 0.1 to 0.3 µm thick is deposited on the main surface of the glass substrate 2 using the SPT or other vacuum film-depositing equipment similar to as done in the five-mask process, and the storage capacitor lines 16 and scan lines 11 doubling as the gate electrodes 11A are selectively formed using photosensitive resin patterns with micro-fabrication technology as shown in FIG. 14(a) and FIG. 15(a).

Next, three thin film layers comprising the SiNx layer 30 composing a gate insulating layer, a first amorphous silicon layer 31 composing a channel for an insulating gate-type transistor including hardly any impurities, and a second amorphous silicon layer 33 composing source-drain for an insulating gate-type transistor including impurities are successively deposited about 0.3 to 0.2 to 0.05 µm, for example, over the entire surface of the glass substrate 2 using the PCVD equipment. Next, a Ti thin film layer 34, for example, as a heat-resistant metal layer about 0.1 µm thick, an Al thin film layer 35 as a low-resistance wire layer about 0.3 µm thick, and a Ti thin film layer 36, for example, as an intermediate conductive layer about 0.1 µm thick, namely, source-drain wire material are successively deposited using the SPT or other vacuum film-depositing equipment. Drain electrodes 21 of insulating gate-type transistors and signal lines 12 doubling as source electrodes are selectively formed. But in this selective patterning, it is a major feature of the streamlined four-mask process to form photosensitive resin patterns 80A and 80B thinner than the 3 µm of source-drain wiring formation regions 80A(12) and 80A(21) with the channel formation region 80B (oblique portion) between the source-drain 1.5 µm thick, for example, as shown in FIG. 14(b) and FIG. 15(b) using half-tone exposure technology.

For such photosensitive resin patterns 80A and 80B, a positive photosensitive resin is ordinarily used in the production of substrates for liquid crystal display devices, so a black, that is, a thin Cr film is formed for the source-drain wire formation region 80A, a gray line and space Cr pattern is formed with a width of 0.5 to 1 µm, for example, for the channel region 80B, and for other regions, a photo-mask may be used to make them white, that is, remove the thin Cr film. It is possible to transmit about half of the photo-mask passing light from a lamp source because the lines and spaces are not resolved due to inadequate exposure resolution, so the photosensitive resin patterns 80A and 80B may be obtained in the gray region having a concave cross-section shape such as that shown in FIG. 15(b) corresponding to the residual film properties of the positive-type photosensitive resin. By forming a MoSi2 thin film, for example, rather than a Cr thin film slit in the gray region, a photo-mask with an equivalent function may be obtained.

After successively etching the Ti thin film layer 36, the Al thin film layer 35, the Ti thin film layer 34, the second amorphous silicon layer 33, and the first amorphous silicon layer 31 using the said photosensitive plastic patterns 80A and 80B as masks to expose the gate insulating layer 30 as shown in FIG. 15(b), the photosensitive resin patterns 80A and 80B are decreased at least 1.5 µm by ashing means such as oxygen plasma, eliminating the photosensitive resin patterns 80B to expose the channel regions, and leaving the photosensitive resin patterns 80C (12) and 80C (21) unchanged only on the source-drain wire formation regions as shown in FIG. 14(c) and FIG. 15(c). Then, the Ti thin film layer, Al thin film layer, Ti thin film layer, second amorphous silicon layer 33A, and first amorphous silicon layer 31A are successively etched again using the reduced photosensitive resin patterns 80C (12) and 80C (21) as masks, and then the first amorphous silicon layer 31A is etched leaving around 0.05 to 0.1 µm. After the metal layer is etched, the first amorphous silicon layer 31A is etched leaving around 0.05 to 0.1 µm, forming the source-drain wires, so the insulating gate-type transistor obtained with such a method is referred to as a channel-etch. The resist pattern 80A is reduced so as to be converted to 80C in the said oxygen plasma treatment, so it is desirable to strengthen the anisotropicity to suppress changes in the pattern dimensions. In further detail, RIE (Reactive Ion Etching) oxygen plasma treatment is desirable, and ICP (Inductive Coupled Plasma) or TCP (Transfer Coupled Plasma) oxygen plasma treatment with a higher density plasma source is even more desirable.

After removing the said photosensitive resin patterns 80C (12) and 80C (21), a second SiNx layer about 0.3 µm thick is deposited as a transparent insulating layer over the entire surface of the glass substrate 2 to make a passivation insulating layer 37 as same as prior five-mask process; openings 62, 63, and 64 are formed on the drain electrodes 21 and in regions to be formed for the electrode terminals for the scan lines 11 and for the signal lines 12, respectively using a photosensitive resin pattern with micro-fabrication technology as shown in FIG. 14(d) and FIG. 15(d); the gate insulating layer 30 and the passivation insulating layer 37 in the openings 63 are removed to expose part 5 of the scan lines; and the passivation insulating layer 37 in the openings 62 and 64 are removed to expose part of the drain electrodes 21 and part 6 of the signal lines. Similarly, openings 65 are formed on the storage capacitor lines 16 to expose part thereof.

Finally, ITO or IZO, for example, is deposited as a transparent conductive layer about 0.1 to 0.2 µm thick using an SPT or other vacuum film-depositing equipment, and transparent conductive pixel electrodes 22 containing the openings 62 are selectively formed on the passivation insulating layer 37 using a photosensitive resin pattern with micro-fabrication technology to complete the active substrate 2 as shown in FIG. 14(e) and FIG. 15(e). For the electrode terminals, transparent conductive electrode terminals 5A and 6A made from ITO are selectively formed on the passivation insulating layer 37 containing the openings 63 and 64.

SUMMARY OF THE INVENTION

In this manner, the contacts (openings) formation processes for the drain electrodes 21 and the scan lines 11 are carried out at the same time in both the five-mask and four-mask processes, so the thickness and type of the insulating layers in the openings 62 and 63 corresponding thereto differ. The film deposition temperature is lower and the film quality inferior in the passivation insulating layer 37 than in the gate insulating layer 30, the etching rate when using a hydrofluoric acid etching solution differs by a magnitude of 10 at several thousand/minute and several hundred/minute respectively, and because the hole diameter cannot be controlled due to an excess of over-etching on the top of the cross-sectional shape of the openings 62 on the drain electrodes 21, dry etching utilizing a fluoride gas is used.

Even if dry etching is used, the openings 62 on the drains electrode 21 comprise only the passivation insulating layer 37, so unlike the openings 63 of the scan lines 11, over-etching of the openings 62 cannot be avoided, and depending on the material, the intermediate conductive layer 36A may be decreased in thickness by the etching gas. In the removal of the photosensitive resin pattern after the etching is complete, about 0.1 to 0.3 μm of the surface of the photosensitive resin pattern is first etched away with oxygen plasma ashing to remove the polymer on the fluoridated surface, then chemical treatment is generally carried out using an organic stripper solution such as stripper 106 manufactured by Tokyo Ohka Kogyo or the like, though when the intermediate conductive layer 36A is reduced to expose the base aluminum layer 35A, an Al2O3 insulator is formed on the surface of the aluminum layer 35A in oxygen plasma ashing treatment, losing good ohmic contact with the pixel electrode 22. This problem may be avoided by setting the film thickness to 0.2 μm, for example, so the intermediate conductive layer 36A may be reduced. Alternately, an avoidance measure is possible wherein the aluminum layer 35A is removed when forming the openings 62 to 65 to expose the thin film layer 34A which is the base heat-resistant metal layer and then form the pixel electrodes 22. This measure has the advantage that the intermediate conductive layer 36A is not required from the beginning.

Still, with the former measure, if the uniformity in these film thickness within surfaces is unfavorable, this approach may not necessarily act effectively either, and this applies identically to cases where the surface uniformity in the etch rate is also unfavorable. With the latter measure, the intermediate conductive layer 36A is unneeded, but a removal process for the aluminum layer 35A is added, and there is the danger that the pixel electrodes 22 may be cut off if the cross-section control of the openings 62 is inadequate.

In addition, if the first amorphous silicon layer 31 including no impurities in the channel region is in no way deposited such as to be on the thick side (ordinarily 0.2 μm or thicker) in the channel etch-type insulating gate-type transistor, the uniformity in the glass substrate surface is greatly affected, leading to a tendency for the transistor characteristics and particularly the "off" current to be irregular. This is greatly affected by the PCVD operation rate and the generation of particles, and is an extremely important item from the perspective of production costs.

Further, in the channel formation process applied in the four-mask process, the source-drain wire materials and the semiconductor layers between the source-drain wires 12, 21 are selectively removed, so this channel formation process determines the length of the channel (4 to 6 μm in products currently being mass produced), which greatly affects the "on" characteristics of the insulating gate-type transistor. Fluctuation in the channel length greatly alters the "on" current value of the insulating gate-type transistor, so strict manufacturing controls are ordinarily required, but the channel length, that is, the pattern dimensions of the half-tone exposure region, is greatly affected by many parameters such as the exposure value (light source strength, and photo-mask pattern accuracy and particularly the line and space dimensions), coating thickness of the photosensitive resin, developing of the photosensitive resin, and the amount of reduction in the photosensitive resin at the etching process; in addition, stable production with a high yield is not necessarily possible while keeping uniformity in these quantities in the surface, and even stricter production control is required than that in conventional manufacturing, so it definitely cannot be said that the art is currently at a high level of completion. This tendency is particularly noticeable when the channel length is 6 μm or shorter. That is because when the photosensitive resin patterns 80A and 80B are isotropically reduced during the reduction of the photosensitive resin patterns 80A and 80B 1.5 μm, the dimension between the photosensitive resin patterns 80A naturally grows 3 μm, so the channel winds up being formed 3 μm longer than the set value.

The present invention takes into account the present state of the art, not only avoiding the defects in forming the contacts common to the conventional five-mask process and the four-mask process, but also realizing four-mask process where half-tone exposure technology having a narrow manufacturing margin is needless.

A streamlined form of the formation process of the pixel electrode disclosed in Unexamined Patent Application Number 7-175088 [i.e., 1995-175088], which is prior art, is first applied in the present invention to reduce the number of manufacturing processes. Next, the gate insulating layer is removed to streamline the contact formation in the gate insulating layer at the formation of the semiconductor layer for the channel-etch insulating gate transistors. And the present invention may be fused with anode-oxidization technology for forming insulating layers in the surfaces of the source-drain wires comprising aluminum that is disclosed in Unexamined Patent Application Number 2-216129 [i.e., 1990-216129] to streamline the process and lower the process temperature. In order to decrease the number of processes more, half-tone exposure technology is applied to the anode-oxidized layer formation of the source-drain wires to streamline the protective layer formation process for the electrode terminals.

[Patent Document 1] Unexamined Patent Application Number 7-74368 [i.e., 1995-74368]

[Patent Document 2] Unexamined Patent Application Number 7-175088 [i.e., 1995-175088]

[Patent Document 3] Unexamined Patent Application Number 2-275925 [i.e., 1990-275925]

[Patent Document 4] Unexamined Patent Application Number 2-216129 [i.e., 1990-216129]

[Patent Document 5] Unexamined Patent Application Number 59-9962 [i.e., 1984-9962]

The liquid crystal display device, recited in claim 1, in which liquid crystal is filled between a first transparent insulating substrate (active substrate) in which unit pixels having at least insulating gate-type transistors, scan lines doubling as gate electrodes and signal lines doubling as source wires of the said insulating gate-type transistors, and pixel electrodes connected to drain wires on a main surface are arranged in a two-dimensional matrix, and a second transparent insulating substrate or a color filter opposing the said first transparent insulating substrate characterized by the fact that at least:

scan lines comprising a laminate of a transparent conductive layer and a first metal layer, transparent conductive pixel electrodes, (and transparent electrode terminals for signal lines) are formed on a main surface of the first transparent insulating substrate, first semiconductor layers including no impurities are formed in island shapes wider than gate electrode through a plasma protecting layer and a gate insulating layer above the gate electrodes, a pair of second semiconductor layers including impurities and composing source-drain for insulating gate transistors are formed on the said first semiconductor layers such as to overlap the gate electrode, openings are formed in the plasma protecting layer and the gate insulating layer on the said pixel electrodes, on part of the scan lines, (and on electrode terminals for the signal lines) to expose the said pixel electrodes and transparent conductive layers forming part of the scan lines (or transparent electrode terminals for the scan lines and the signal lines), signal lines are formed on the said second semiconductor layers and on the gate insulating layer, drain wires are formed on the second semiconductor layers, on the gate insulating layer and on part of the said pixel electrodes, both comprising a second anodizable metal layer of one or more metal layers including a heat resistant metal layer, and electrode terminals for the signal lines forming part of the signal line are formed outside an image display region, (or signal lines are formed on the said second semiconductor layers, on the gate insulating layer, and on part of transparent conductive electrode terminals for the signal lines, and drain wires are formed on the second semiconductor layers, on the gate insulating layer and on part of the said pixel electrodes, both comprising a second anodizable metal layer of one or more layers,)

anodized layers are formed on the source-drain wires except electrode terminals for the said signal lines, and silicon oxide layers are formed on the first semiconductor layers between the source-drain wires.

Through this construction, transparent conductive pixel electrodes are formed at the same time as the scan lines, so they are formed on the glass substrate. Insulating gate-type transistor used is a channel-etch type, and a silicon oxide layer is formed on a channel between source-drain to protect the channel of the insulating gate-type transistor, and insulating anode-oxidized layers, aluminum oxide layers (Al2O3) for example, are formed on the surfaces of the signal lines and the drain wires, a TN-type liquid crystal display device is obtained with a passivation function. Either a transparent conductive layer or a metal layer may be selected for electrode terminals, but a metal layer has fewer limitations against processing.

The liquid crystal display device, recited in claim 6, in which liquid crystal is filled between a first transparent insulating substrate (active substrate) in which unit pixels having at least insulating gate-type transistors, scan lines doubling as gate electrodes and signal lines doubling source wire of the said insulating gate-type transistors, and pixel electrodes connected to drain wires, (and counter electrodes formed separated at a prescribed distance from the said pixel electrodes) on a main surface are arranged in a two-dimensional matrix, and a second transparent insulating substrate or a color filter opposing the said first transparent insulating substrate characterized by the fact that at least:

scan lines comprising a first metal layer or a laminate of a transparent conductive layer and a first metal layer are formed on a main surface of the first transparent insulating substrate, the said scan lines are exposed except at island-shaped semiconductor layer areas in and around gate electrodes, and the said exposed scan lines are insulated again with a passivation insulating layer or with anode-oxidized layers thereof.

Through this construction, transparent conductive pixel electrodes are formed at the same time as the scan lines, so they are formed on the glass substrate. Exposed scan lines at the formation of semiconductor layers are protected again with a passivation insulating layers or with anode-oxidized layers thereof and the equivalent reliability is given compared with the prior liquid crystal display devices.

The liquid crystal display device in claim 9 as recited in claim 6 is characterized by the fact that at least:

scan lines comprising a laminate of a transparent conductive layer and a first metal layer, transparent conductive electrode terminals for the scan lines forming part of the scan lines, transparent conductive pixel electrodes laminated with a first metal layer at their peripheries, and transparent conductive electrode terminals for the signal lines laminated with a first metal layer at their peripheries, are formed on a main surface of the first transparent insulating substrate, laminates of a plasma protecting layer, a gate insulating layer and a first semiconductor layer including no impurities are formed in island shapes wider than the gate electrode on the gate electrodes and in and around the scan lines at the intersections of the scan line and the signal line respectively, a pair of second semiconductor layers including impurities and composing source-drain for insulating gate transistors are formed on the said first semiconductor layers such as to overlap the gate electrode, and second semiconductor layers including impurities are formed on the first semiconductor layers at the said intersections, source wires (signal lines) are formed on the said second semiconductor layers, on the first transparent insulating substrate, and on the first metal layers of the said electrode terminals for the signal lines, drain wires are formed on the said second semiconductor layers, on the first transparent insulating substrate, and on part of the first metal layers of the said pixel electrodes, both comprising a second metal layer of one or more layers including a heat resistant metal layer, and a passivation insulating layer is formed on the said first transparent insulating substrate having openings on the said transparent conductive pixel electrodes and on the transparent conductive electrode terminals for the scan lines and the signal lines.

Through this construction, transparent conductive pixel electrodes are formed at the same time as the scan lines, so they are formed on the glass substrate. Insulating gate-type transistor used is a channel-etch type, and a conventional passivation insulating layer is formed on an active substrate to protect the scan lines in addition to the channels and the source-drain wires. A TN-type liquid crystal display device is obtained in which the electrode terminals are limited to transparent conductive layers.

The liquid crystal display device in claim 10 as recited in claim 6 is also characterized by the fact that at least:

scan lines and counter electrodes comprising a first metal layer of one or more layers are formed on a main surface of the first transparent insulating substrate, laminates of a first semiconductor layer including no impurities and a gate insulating layer are formed in island shapes wider than the gate electrode, the scan line and the counter electrode, respectively on the gate electrodes, in and around the scan lines at the intersections of the scan line and the signal line, in and around the counter electrodes at the intersections of the counter electrode and the signal line, and in and around the counter electrodes at the intersections of the counter electrode and the pixel electrode, a pair of second semiconductor layers including impurities and composing source-drain for the insulating gate transistor are formed on the said first semiconductor layers above the gate electrode such as to overlap the gate electrode, and second semiconductor layers including impurities are formed on the first semiconductor layers in and around the said intersections, source wirings (signal lines) and drain wires (pixel electrodes) are formed on the said second semiconductor layers and on the first transparent insulating substrate, comprising an second metal layer of one or more layers including a heat resistant metal layer, electrode terminals for the scan lines are formed on part of the scan lines comprising a second metal layer, and electrode terminals for the signal lines forming part of the signal lines, are formed outside an image display region, and a passivation insulating layer is formed on the said first transparent insulating substrate having openings on the said electrode terminals for the scan lines and the signal lines.

Through this construction, pixel electrodes and counter electrodes are formed on the glass substrate. Insulating gate-type transistor used is a channel-etch type, and an IPS-type liquid crystal display device is obtained wherein a conventional passivation insulating layer is formed on an active substrate to protect the scan lines and the counter electrodes in addition to the channels and the source-drain wires.

The liquid crystal display device in claim 12 as recited in claim 6 is also characterized by the fact that at least:

scan lines and counter electrodes comprising a first anodizable metal layer of one or more layers are formed on a main surface of the first transparent insulating substrate, laminates of a first semiconductor layer including no impurities and a gate insulating layer are formed in island shapes wider than the gate electrode, the scan line and the counter electrode, respectively on the gate electrodes, in and around the scan lines at the intersections of the scan line and the signal line, in and around the counter electrodes at the intersections of the counter electrode and the signal line, and in and around the counter electrodes at the intersections of the counter electrode and the pixel electrode, a pair of second semiconductor layers including impurities and composing source-drain for the insulating gate transistor are formed on the said first semiconductor layers above the gate electrodes such as to overlap the gate electrode, and the second semiconductor layers including impurities are formed on the first semiconductor layers near the said intersections, source wiring (signal line) and drain wire (pixel electrode) are formed on the second semiconductor layers and on the first transparent insulating substrate, comprising a second anodizable metal layer of one or more layers including a heat resistant metal layer, and electrode terminals for the scan lines comprising an anodizable second layer are formed on part of the scan lines, and electrode terminals for the signal lines forming part of the signal lines are formed outside an image display region, anodized layer are formed on the source-drain wires except electrode terminals for the signal lines, silicon oxide layers are formed on the first semiconductor layers between the source-drain wires and near the said intersections, and anodized layers are formed on the said scan lines and the counter electrodes except for the said gate electrodes, the said intersections and the electrode terminal connecting areas for the scan lines.

Through this construction, pixel electrodes and counter electrodes are formed on the glass substrate. Insulating gate-type transistor used is a channel-etch type, and an IPS-type liquid crystal display device is obtained with a passivation function wherein silicon oxide layers are formed on the channels between the source-drain to protect the channels of insulating gate-type transistors, insulating anode-oxidized layers such as aluminum oxide, for example, are formed on the surfaces of the signal lines and the drain wires, and insulating anode-oxidized layers are formed also on the scan lines and the counter electrodes.

claim 15 is a manufacturing method for the liquid crystal display device recited in claim 1 having, a process for forming scan lines and pseudo-pixel electrodes, both comprising a laminate of a transparent conductive layer and a first metal layer, a process for forming semiconductor layers in island shapes above the gate electrodes, a process for forming openings in the gate insulating layer and the plasma protective layer on the said pseudo-pixel electrodes and removing the first metal layer in the openings to expose the transparent conductive pixel electrodes, and a process for forming source-drain wires (by using a half tone exposure technology) and for anodizing the source-drain wires and amorphous silicon layers between the source-drain wires.

Through this construction, it is possible to decrease the number of photo-etching processes for forming scan lines and forming pixel electrodes using one photo-mask. In addition, a TN-type liquid crystal display device can be produced with 4 photo-masks by anodizing source-drain wires after the formation of source-drain wires to form silicon oxide layers on the channels between the source-drain wires protecting the channels also helped by the reduced number of manufacturing processes that do not require a passivation insulating layer.

claim 19 is a manufacturing method for the liquid crystal display device recited in claim 6 having, a process for forming island shaped semiconductor layers comprising a laminate of a gate insulating layer, a first semiconductor layer and a second semiconductor layer wider than gate electrode on the gate electrodes to expose the said scan lines, and a process for depositing a passivation insulating layer on the said first transparent insulating substrate or for anode-oxidizing the scan lines comprising an anodizable metal layer to insulate the said exposed scan lines.

Through this construction, reduced number of manufacturing processes is obtained by streamlining the island formation process of the semiconductor layers. The once exposed scan lines are protected again with a passivation insulating layer or with the anodized layers of the scan lines and the equivalent reliability is given compared with the prior liquid crystal display devices.

claim 23 is a manufacturing method for the liquid crystal display device recited in claim 9 having, a process for forming scan lines and pseudo-pixel electrodes, both comprising a laminate of a transparent conductive layer and a first metal layer, a process for forming the semiconductor layers and the gate insulating layers in island shapes on the gate electrodes to expose the scan lines and the pseudo-pixel electrodes, a process for forming the source-drain wires, and a process for forming openings on the pseudo-pixel electrodes after the deposition of a passivation insulating layer, and removing the first metal layers on the pseudo-pixel electrodes to expose the transparent conductive pixel electrodes.

Through this construction, it is possible to decrease the number of photo-etching processes for treating the scan lines formation process and the pixel electrodes formation process using one photo-mask. In addition, a TN-type liquid crystal display device can be produced with 4 photo-masks without half tone exposure technology by removing the gate insulating layer further at the formation of the semiconductor layers for channel-etch type insulating gate transistors also helped by the streamlining that does not require the contact formation process.

claim 24 is a manufacturing method for the liquid crystal display device recited in claim 10 having, a process for forming scan lines and counter electrodes, a process for forming the semiconductor layers and the gate insulating layers in island shapes near the intersections of the scan line and the signal line, near the intersections of the counter electrode and the signal line, and near the intersections of the counter electrode and the pixel electrode in addition to on the gate electrodes, to expose the scan lines and the counter electrodes, a process for forming the source wires (signal lines) and drain wires (pixel electrodes), and a process for forming a passivation insulating layer to have openings on the electrode terminals.

An IPS-type liquid crystal display device can be produced with 4 photo-masks without half tone exposure technology by removing the gate insulating layer at the formation of the semiconductor layers for channel-etch type insulating gate transistors also helped by the streamlining that does not require the contact formation process.

claim 26 is a manufacturing method for the liquid crystal display device recited in claim 12 having, a process for forming scan lines and counter electrodes, a process for forming the semiconductor layers and the gate insulating layers in island shapes near the intersections of the scan line and the signal line, near the intersections of the counter electrode and the signal line, and near the intersections of the counter electrode and the pixel electrode in addition to on the gate electrodes, to expose the scan lines and the counter electrodes, and a process for forming the source wires (signal lines) and drain wires (pixel electrodes) and for anodizing the scan lines and the counter electrodes in addition to the source-drain wires and the channels.

Through this construction, it is possible to decrease the number of manufacturing processes by removing the gate insulating layer at the formation of the semiconductor layers for channel-etch type insulating gate transistors and by anodizing the source-drain wires after the formation of the source-drain wires using half tone exposure technology to form silicon oxides on the channels between the source-drain wires protecting the channels and to form the passivation insulating layer unnecessary, an IPS-type liquid crystal display device can be produced with 3 photo-masks.

As described above, the streamlining technology was set as a core, in which the gate insulating layer is removed at the formation of the semiconductor layer for the channel-etch type insulating gate transistor and the formation of contacts is unneeded in this invention, various active substrates and corresponding manufacturing methods thereof are suggested based on this composition. In TN type liquid crystal displays, the formation process of pixel electrodes is streamlined by removing the first metal layer at the formation of openings in the passivation insulating layer after forming scan lines, pseudo-pixel electrodes and pseudo-electrode terminals comprising a laminate of a transparent conductive layer and a first metal layer, for instance. 4-mask processes may be obtained basically without half tone exposure technology differing from the prior 4-mask process. Thus outstanding merit is obtained strict process management to be unnecessary. In other words, production is easy with stable yield and quality.

As made clear in the above description, the requirements of the present invention are to remove the gate insulating layer further at the formation of semiconductor layers for the channel-etch type insulating gate transistor and to make the formation process of contacts unnecessary, and for construction other than that, the fact is self-evident that a semiconductor device for the display device with a different film thickness or material such as the scan line, the signal lines, the pixel electrode or a gate insulating layer, and differences in the manufacturing method thereof belong to the category of the present invention, and it is also clear that the semiconductor layer for the insulating gate-type transistor is not limited to amorphous silicon.

DETAILED DESCRIPTION OF THE PREFERRED EMBODIMENT

Figure 1:
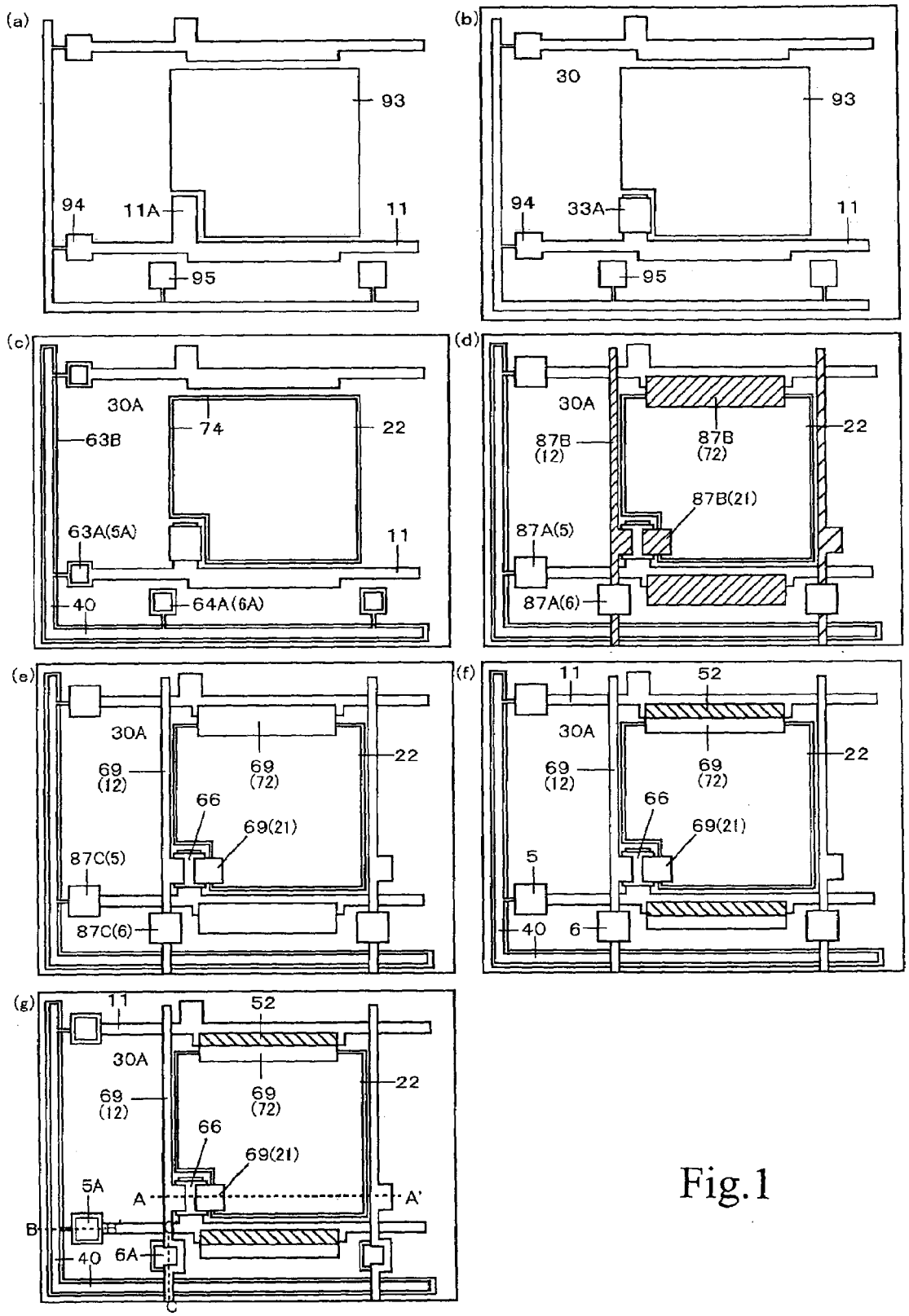
[FIG. 1] A plan view of the active substrate in Embodiment 1 of the present invention
Figure 2:
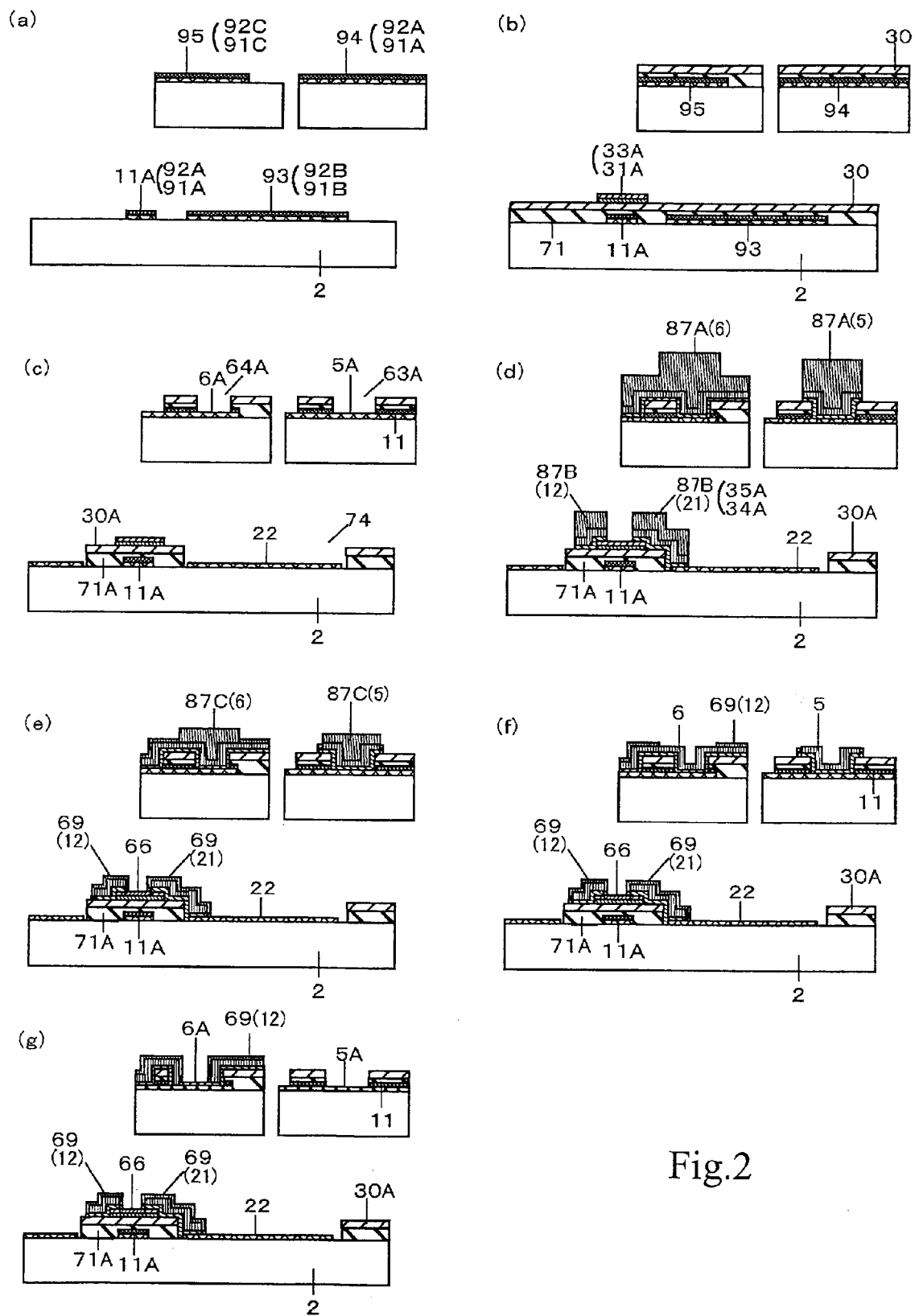
[FIG. 2] A cross-sectional view for the manufacturing process of the active substrate in Embodiment 1 of the present invention
Figure 3:
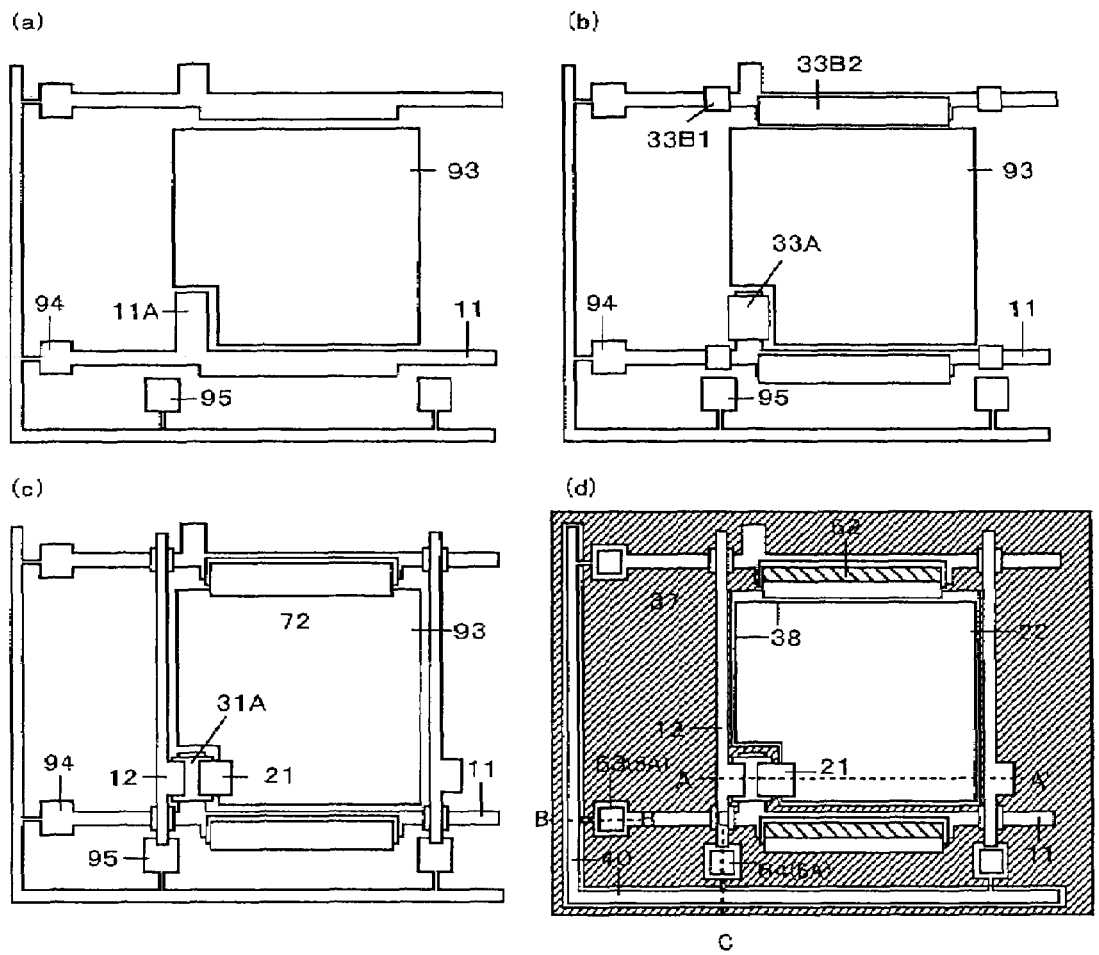
[FIG. 3] A plan view of the active substrate in Embodiment 2 of the present invention
Figure 4:
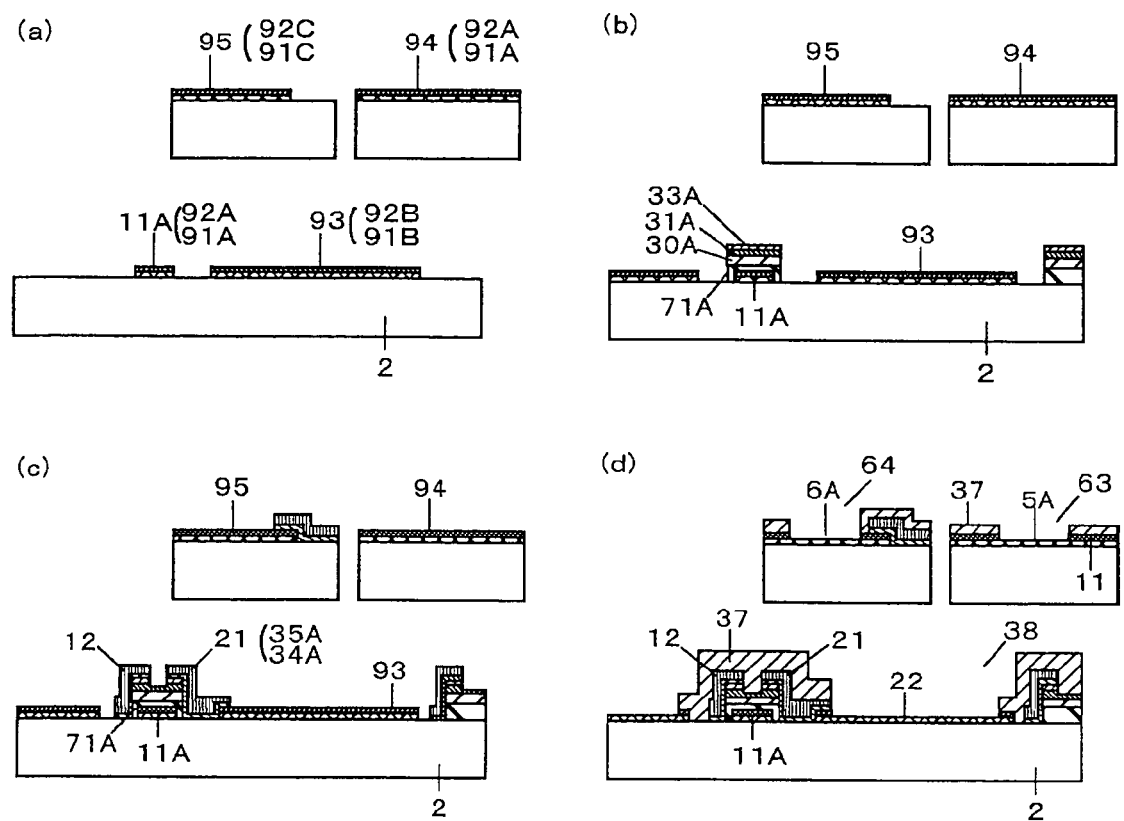
[FIG. 4] A cross-sectional view for the manufacturing process of the active substrate in Embodiment 2 of the present invention
Figure 5:
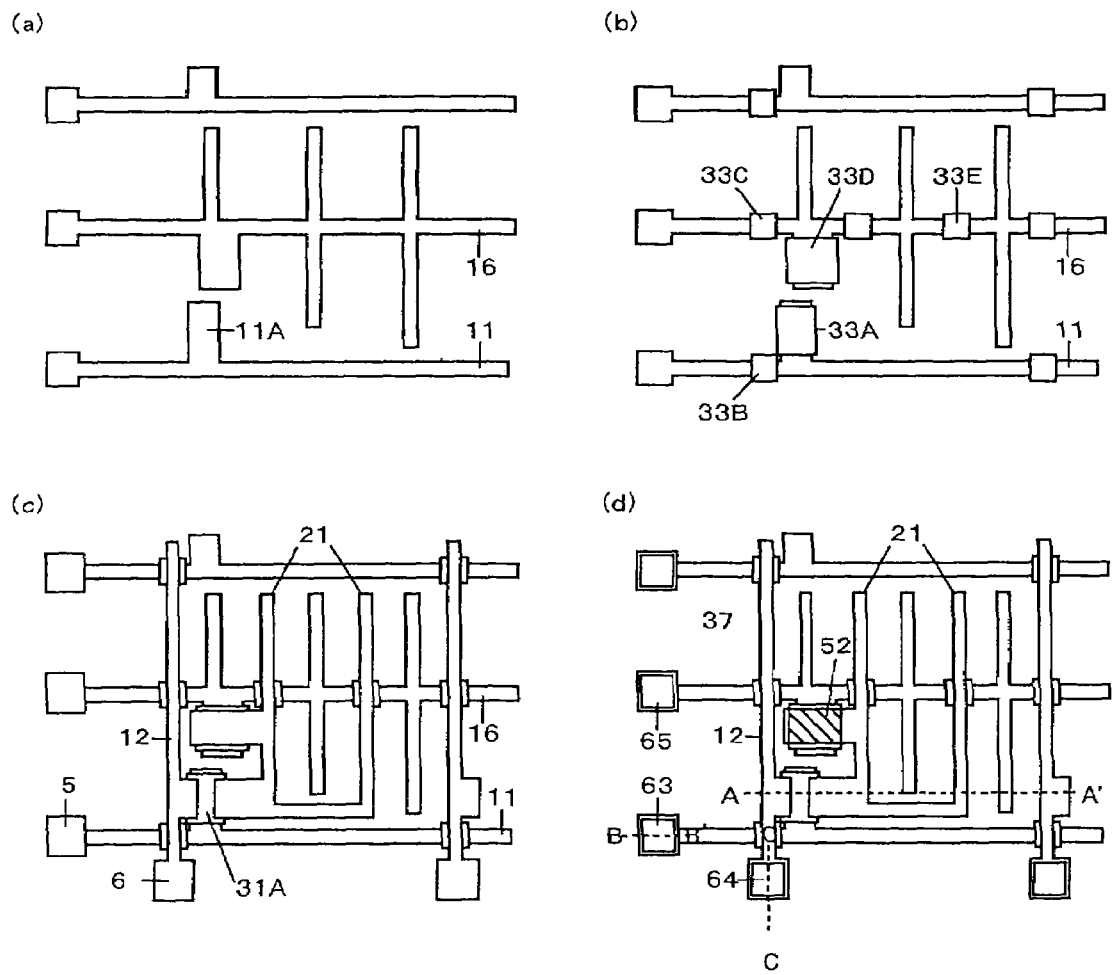
[FIG. 5] A plan view of the active substrate in Embodiment 3 of the present invention
Figure 6:
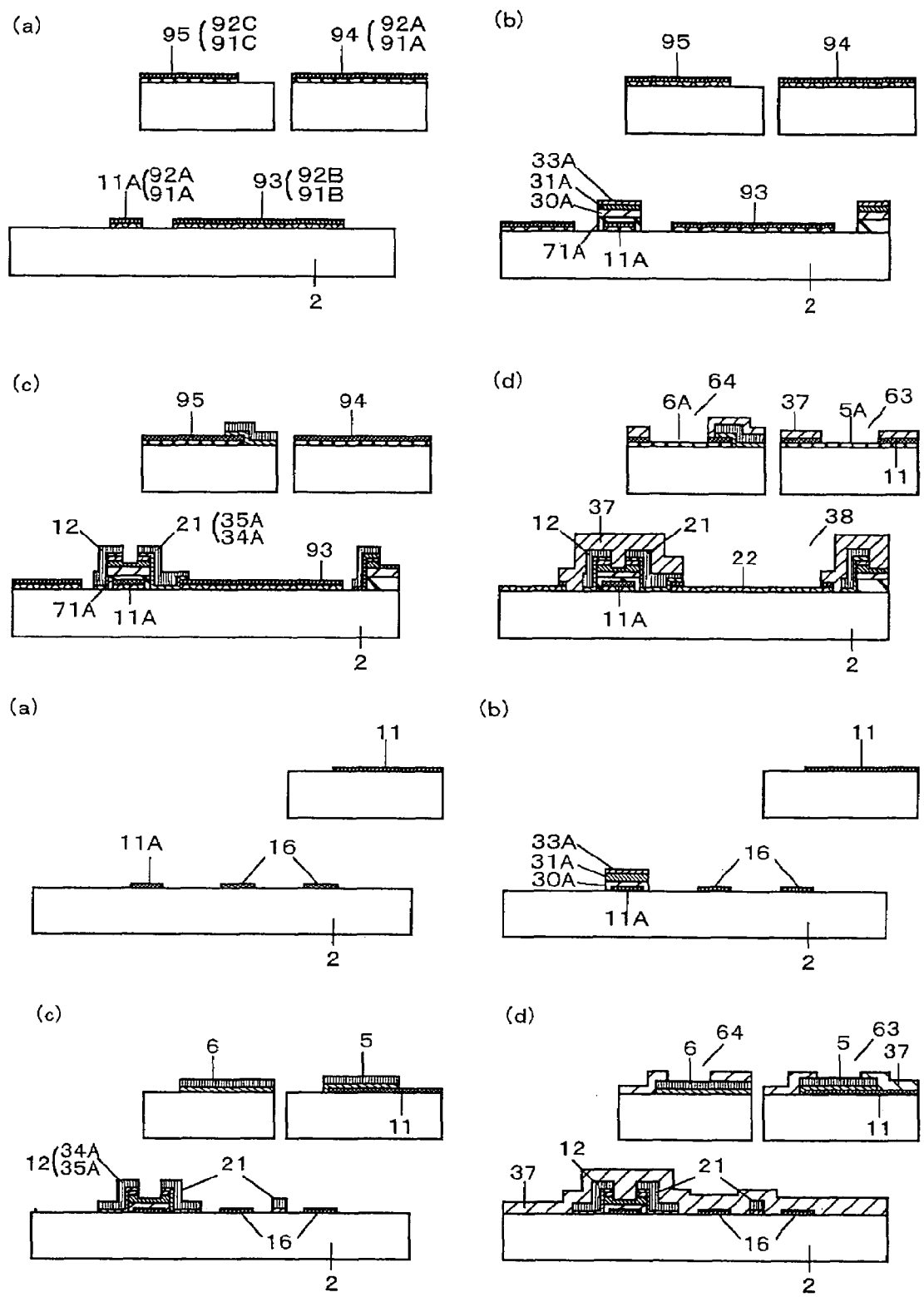
[FIG. 6] A cross-sectional view for the manufacturing process of the active substrate in Embodiment 3 of the present invention
Figure 7:
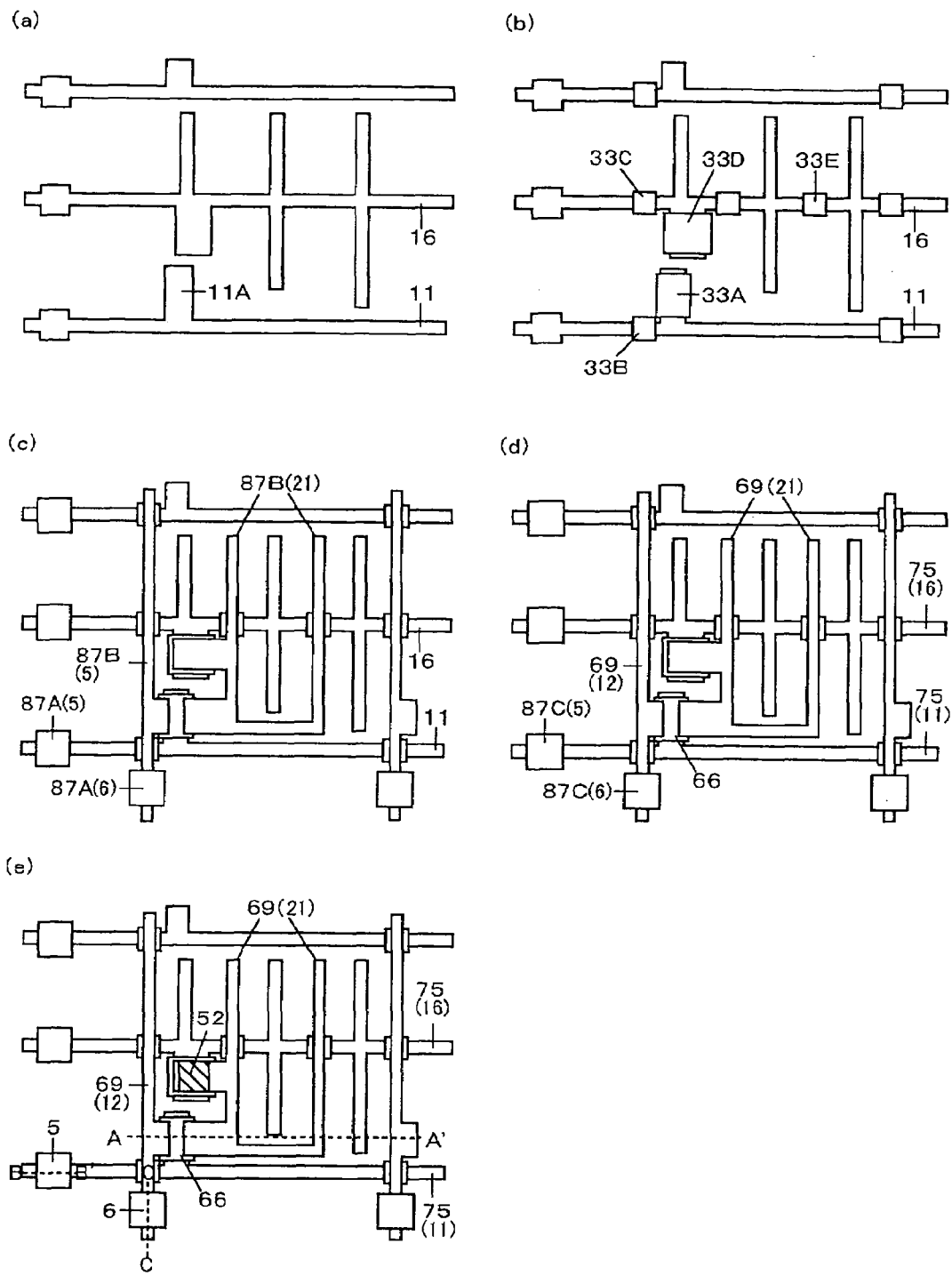
[FIG. 7] A plan view of the active substrate in Embodiment 4 of the present invention
Figure 8:
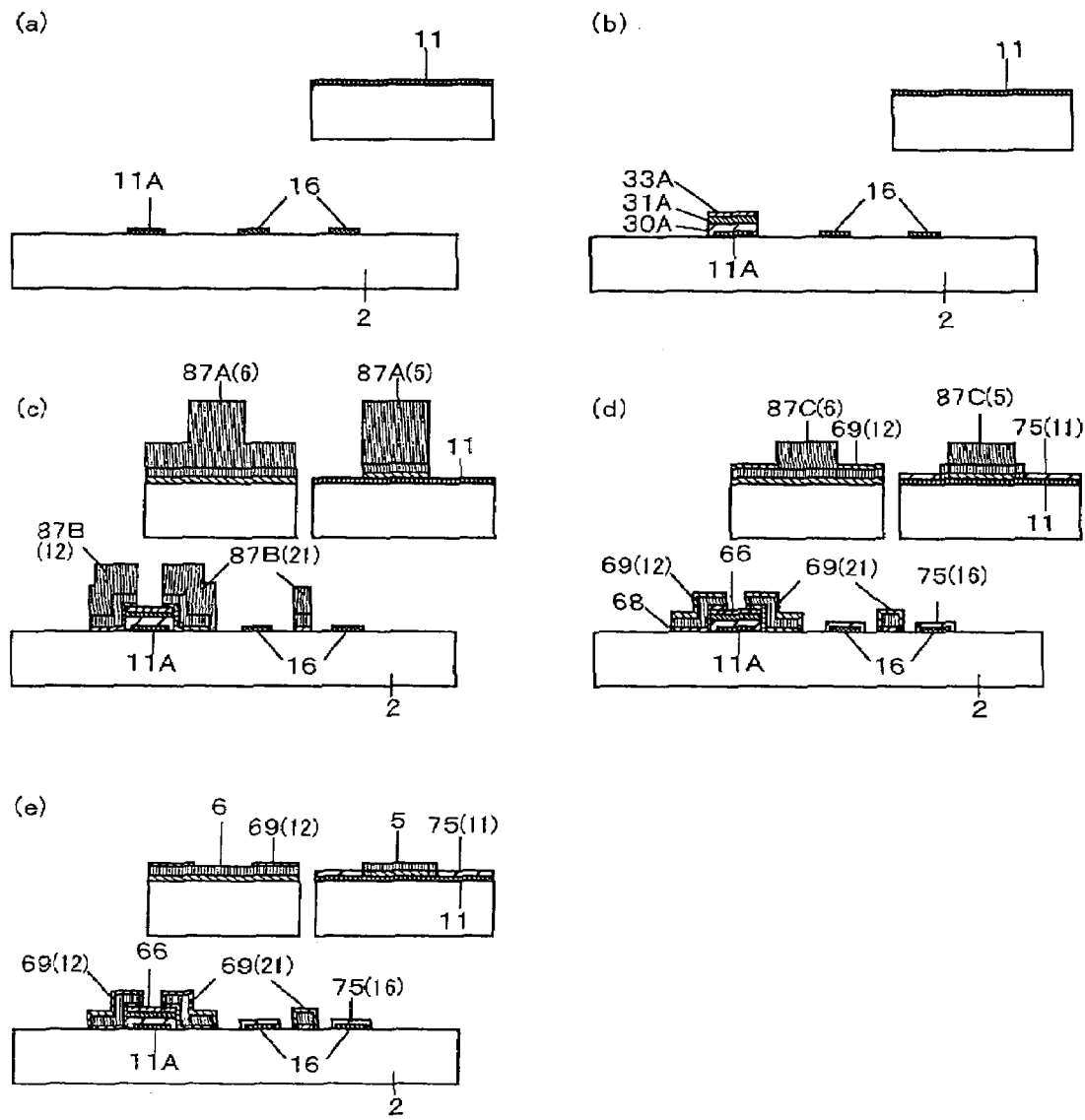
[FIG. 8] A cross-sectional view for the manufacturing process of the active substrate in Embodiment 4 of the present invention
Figure 9:
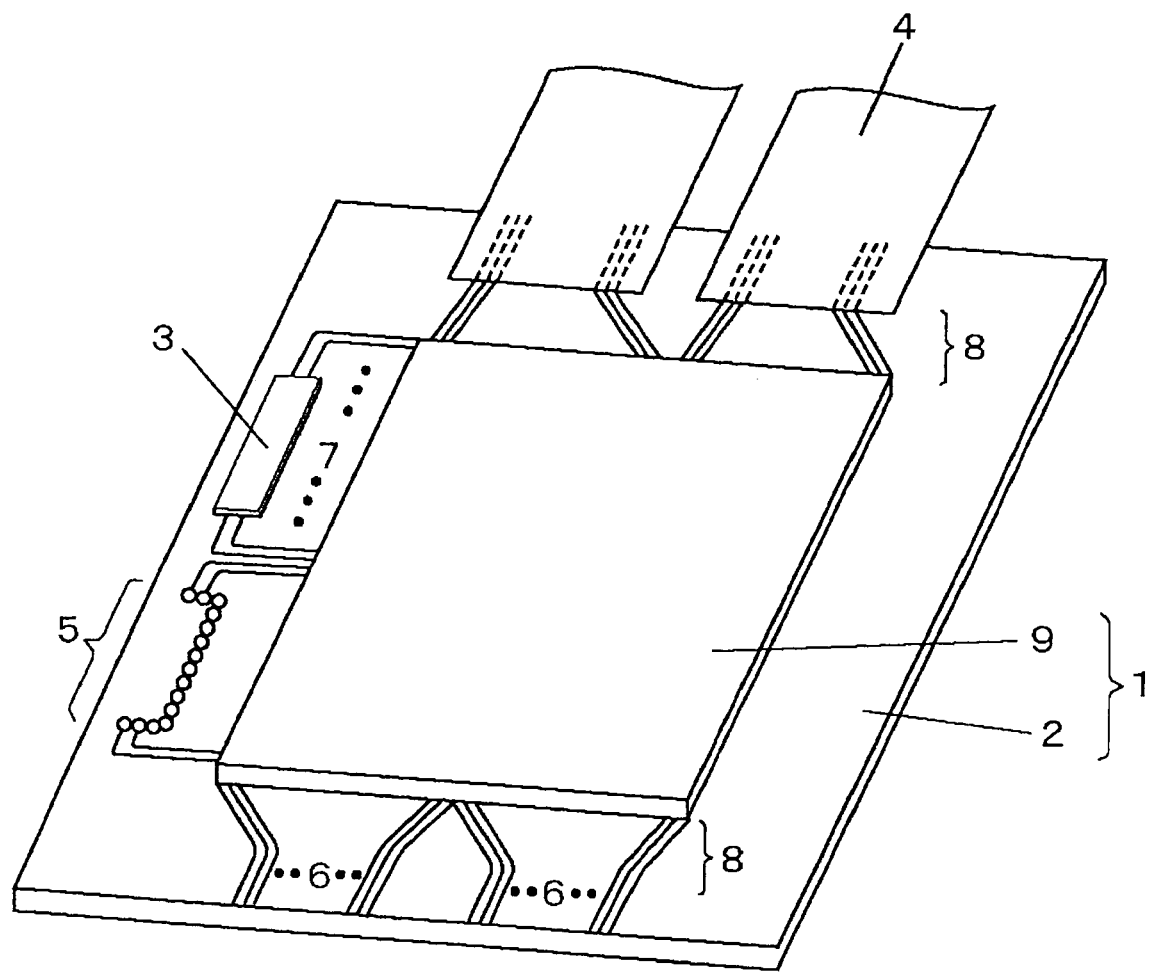
[FIG. 9] A perspective view showing the mounted state of the liquid crystal panel
Figure 10:
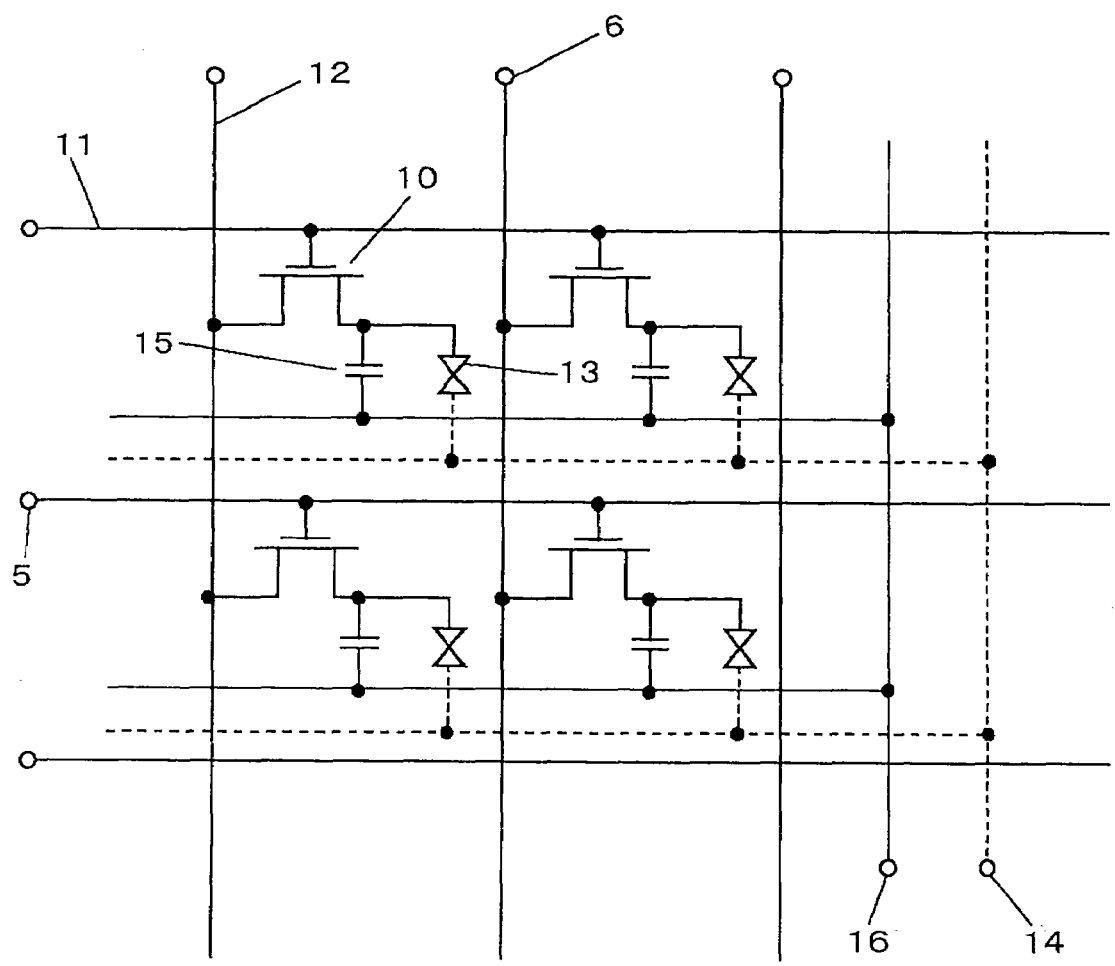
[FIG. 10] An equivalent circuit of the liquid crystal panel
Figure 11:
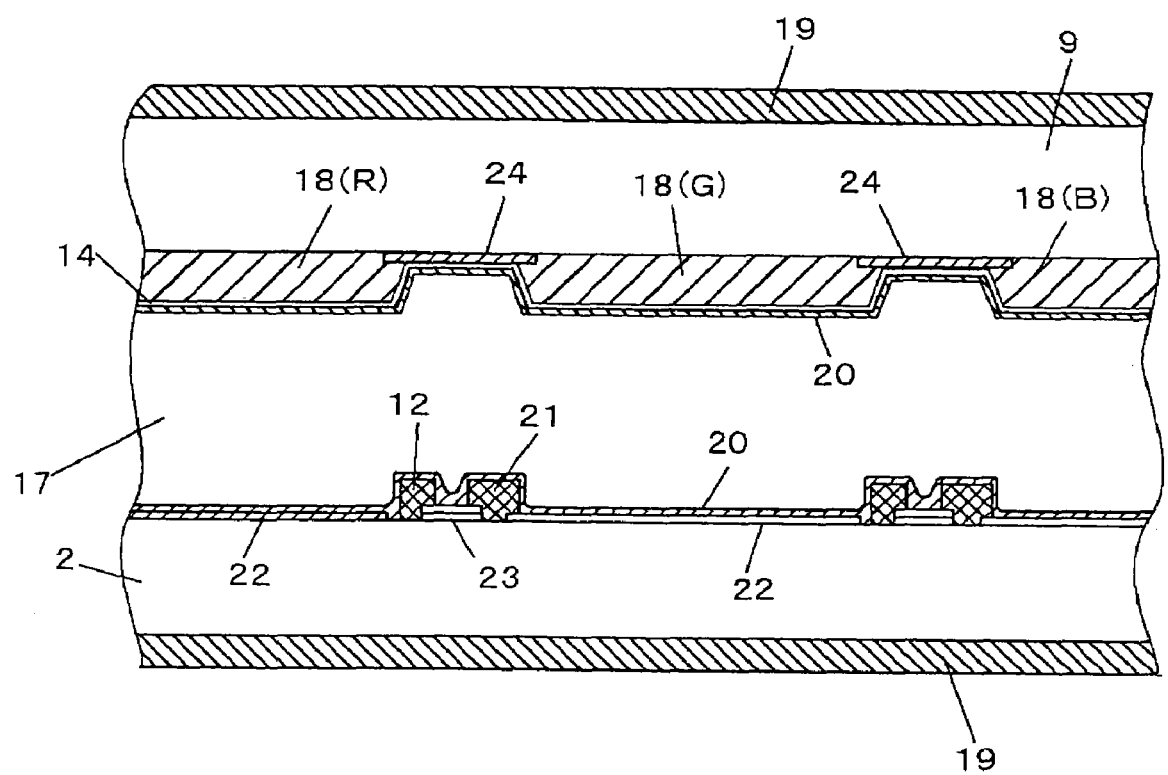
[FIG. 11] A cross-sectional view of a conventional liquid crystal panel
Figure 12:
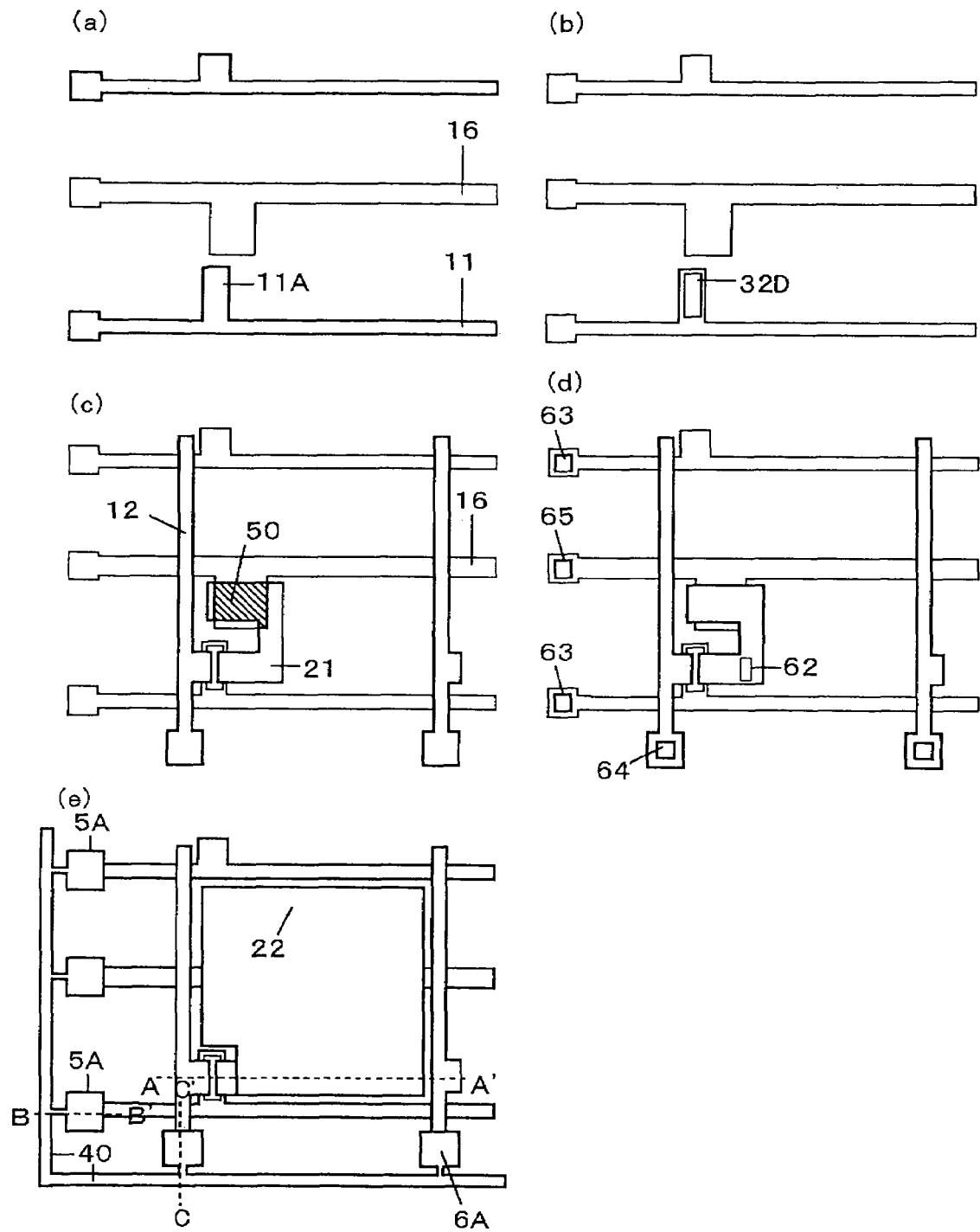
[FIG. 12] A plan view of the active substrate in the prior art example
Figure 13:
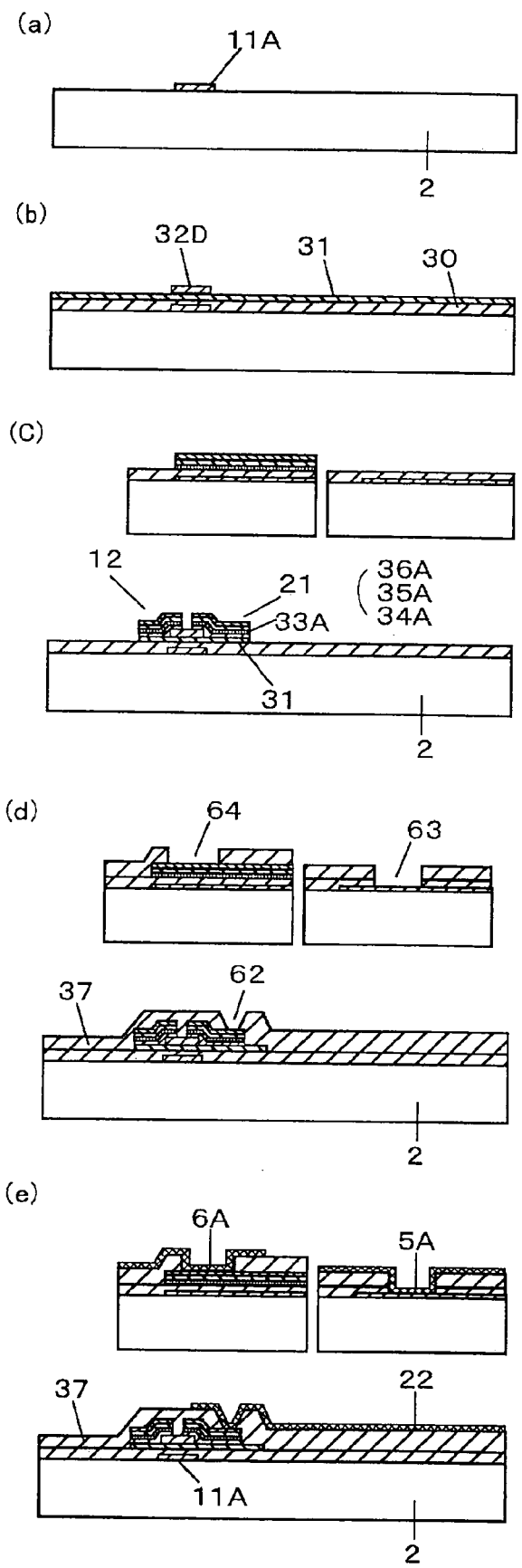
[FIG. 13] A cross-sectional view of the manufacturing process for the active substrate in the prior art example
Figure 14:
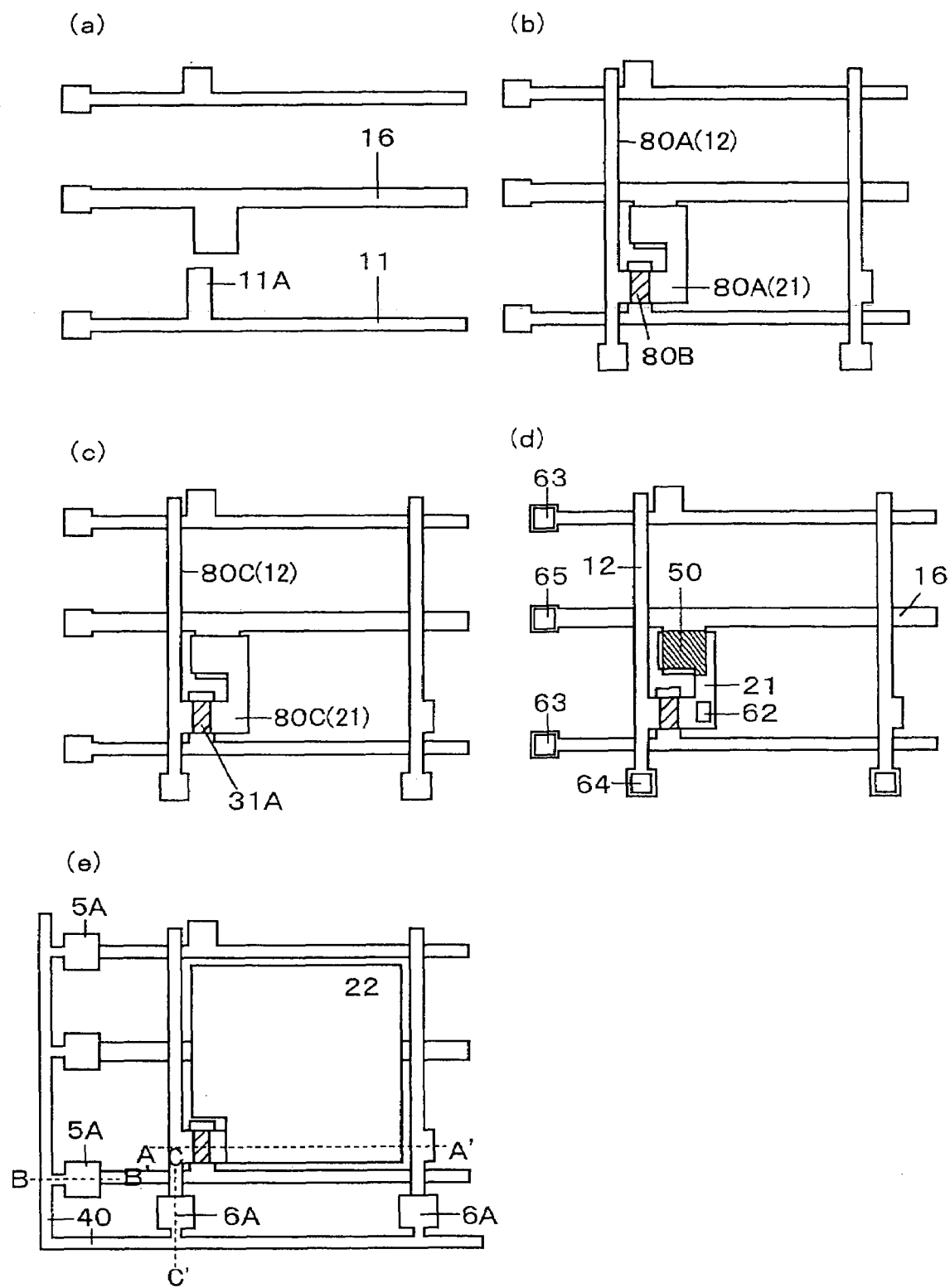
[FIG. 14] A plan view of a streamlined active substrate
Figure 15:
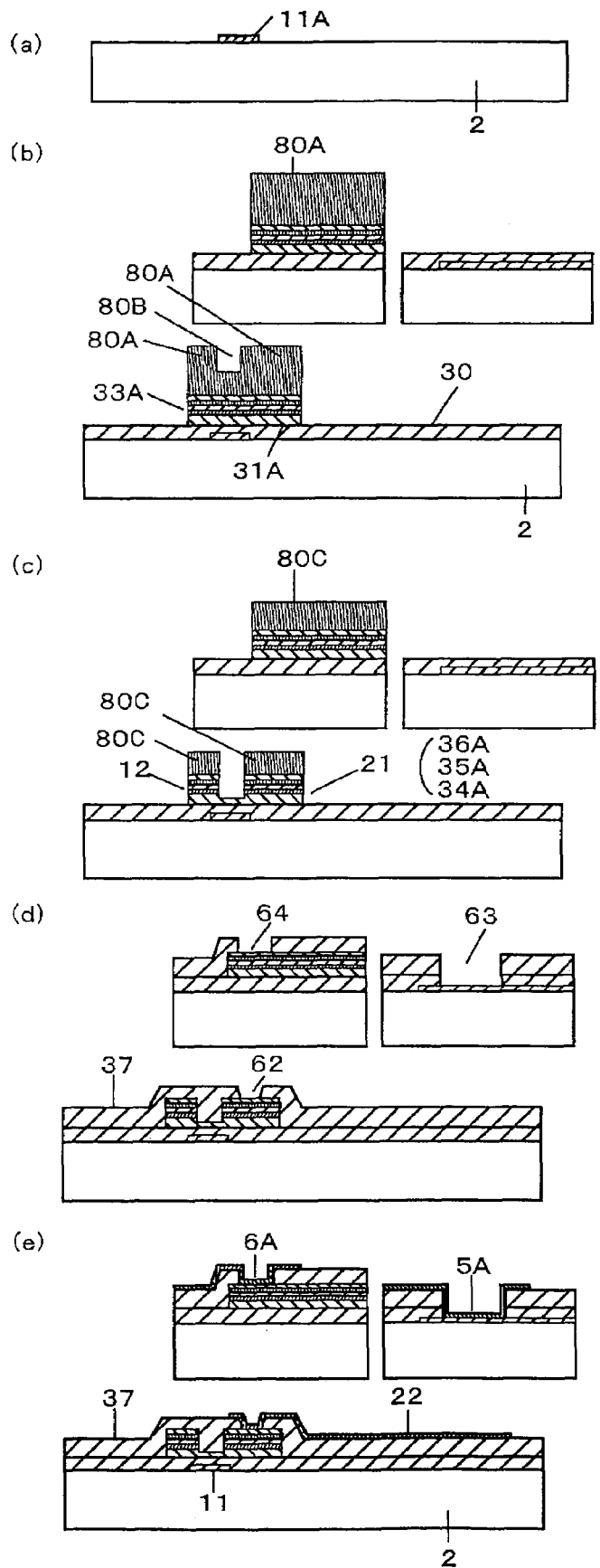
[FIG. 15] A cross-sectional view of the manufacturing process for a streamlined active substrate

Embodiments of the invention are described below with reference to FIGS. 1 to 8. FIG. 1 shows plan views of a semiconductor device (active substrate) for a display device pertaining to a first embodiment of the present invention. FIG. 2 shows cross-sectional views of the manufacturing processes of lines A-A', B-B' and C-C' in FIG. 1. Similarly, FIG. 3 and FIG. 4 show plan views of an active substrate and cross-sectional views of a manufacturing process for Embodiment 2, and similarly so, FIG. 5 and FIG. 6 for Embodiment 3, FIG. 7 and FIG. 8 for Embodiment 4. The reference numerals used in one part of the conventional example are used similarly in other examples, so a detailed description thereof is omitted.

Embodiment 1

In Embodiment 1, first deposit a transparent conductive layer 91 of 0.1-0.2 μm in thickness, ITO for example, and a first metal layer 92 of 0.1-0.3 μm in thickness, a metal with a high melting point such as Cr, Ta, or MoW, for example, on a principal plane of a glass substrate 2 using a vacuum film-depositing equipment such as an SPT. An aluminum layer sandwiched with a heat-resistant metal layer or an aluminum alloy layer including Nd may also be selected in order to lower the resistance of the scan line such that a battery reaction does not occur between the ITO in an alkaline developing solution or in a resist stripping solution.

Next, selectively form 1) scan lines 11 doubling as gate electrodes 11A and pseudo-electrode terminals 94 for scan lines comprising a laminate of a transparent conductive layer 91A and a first metal layer 92A, 2) pseudo-pixel electrodes 93 comprising a laminate of a transparent conductive layer 91B and a first metal layer 92B, and 3) pseudo-electrode terminals 95 for signal lines comprising a laminate of a transparent conductive layer 91C and a first metal layer 92C by successively etching the first metal layer 92 and the transparent conductive layer 92 using fine-processing technology such as photosensitive resin patterns to expose the glass substrate 2 as shown in FIG. 1(a) and 2(a). Dry etching is desirable in order to increase the yield by improving insulation break down voltage between with the scan lines and the signal lines through a gate insulating layer and by controlling the tapering of the cross-section shape on the electrodes thereof through.

Further, deposit a transparent insulating layer, such as TaOx and SiO2 at approximately 0.1 μm of film thickness composing a plasma protective layer on the entire surface of a glass substrate 2, and this is numbered 71. This plasma protective layer 71 is necessary to avoid the SiNx film quality from changing when the transparent conductive layers 91A that are exposed at the edge sections of the scan lines 11 at the deposition of SiNx, which is a gate insulating layer and formed by the PCVD equipment mentioned hereinafter; see the prior Japanese Unexamined Patent Application Publication S59-9962 for detail.

After depositing a plasma protecting layer 71, deposit the following 3 thin film layers successively using the PVD equipment as with conventional embodiments, for example approximately at 0.2, 0.1, and 0.05 μm in thickness, respectively: 1) a first SiNx layer 30 composing a gate insulating layer, 2) a first amorphous silicon layer 31 including almost no impurities and composing the channels for insulating gate type transistors, and 3) a second amorphous silicon layers 33 including impurities and composing the source-drains for the insulating gate type transistors. As the gate insulating layer is the laminate of a plasma protective layer and a first SiNx layer here, the first SiNx layer may be formed thinner than the conventional embodiments as a result.

As shown in FIGS. 1(b) and 2(b) using fine-processing technology such as photosensitive resin patterns, selectively leave laminates of the second amorphous silicon layer 33 and the first amorphous silicon layer 31 wider than gate electrode 11A, making them islands 31A and 33A, respectively, and expose the gate insulating layer 30.

Continuingly, 1) form openings 74 on the pseudo-pixel electrodes 93, and openings 63A and 64A on the pseudo-electrode terminals 94 and 95, 2) remove first metal layers of 92A to 92C in addition to a gate insulating layer 30 and a plasma protective layer 71 within each opening, and 3) expose transparent conductive pixel electrodes 22 and transparent conductive electrode terminals 5A and 6A as shown in FIGS. 1(c) and 2(c) using fine-processing technology such as photosensitive resin patterns. It is possible to from openings 63B on the static electricity countermeasure lines and to make them as short lines 40 for static electricity outside an image display area.

At the formation of source-drain wires, 1) deposit a) a thin film layer 34 as an anode-oxidizable heat resistant metal layer, such as Ti and Ta, at approximately 0.1 μm in thickness and b) an AL thin film layer 35 as an anode-oxidizable low resistance wire layer at approximately 0.3 μm in thickness. Next, 2) successively etch the source-drain wire materials comprising these 2 thin film layers using fine processing technology such as photosensitive resin patterns 87A and 87B, and 3) selectively form a) drain electrodes 21 for the insulating gate type transistors containing part of the pixel electrodes 22 within openings 74, and b) signal lines 12 doubling as source electrodes, both comprising a laminate of 34A and 35A as shown in FIGS. 1(d) and 2(d). It is unnecessary here to etch the first amorphous silicon layer 31A including no impurities and the second amorphous silicon layer 33A including impurities. At the time the source-drain wires 12 and 21 are formed, electrode terminals 5 for the scan lines containing part of the scan lines 5A comprising a transparent conductive layer and electrode terminals 6 forming part of the signal lines are also formed. Embodiment 1 is characterized especially by forming, in advance, photosensitive resin patterns 87A and 87B, which are thicker than 3 μm in thickness for example, the film thickness of areas (black areas) 87A (5) and 87A (6) that correspond to electrode terminals 5 and 6 or thicker than 1.5 μm for example, the film thickness of areas (halftone areas) 87B (12), 87B (12) and 87 (72) that correspond to the source wire 12, the drain wire 21 and storage capacitor electrode 72 using halftone exposure technology.

After the formation of the source-drain wires 12 and 21, the photosensitive resin patterns 87B disappear if the said photosensitive resin patterns 87A and 87B are reduced in film thickness by 1.5 μm or more, using an ashing method such as oxygen plasma, exposing the source-drain wires 12 and 21, and the storage capacitor electrode 72; photosensitive resin patterns 87C (5) and 87C (6) can be left as they are only on the electrode terminals 5, 6. Now, 1) anode-oxidize the source-drain wires 12 and 21 while illuminating light using photosensitive resin patterns 87C (5) and 87C (6) as masks as shown in FIGS. 1(e) and 2(e), forming oxidized layers 68 and 69 and 2) at the same time, anode-oxidize the second amorphous silicon layer 33A which is exposed between the source-drain wires 12 and 21, and also anode-oxidize part of the first amorphous silicon layer 31A which is adjacent to the second amorphous silicon layer 33A, forming a) a silicon oxide layer 66 including impurities, and b) and a silicon oxide layer (not shown) including no impurities, both are insulating layers.

AL is exposed in the upper surface, and lamination layers of AL and Ti are exposed on the sides of the source-drain wires 12 and 21; through anode oxidization, Ti is changed to a semiconductor titanium oxide (TiO2) 68 and AL to an insulating layer alumina (AL2O3) 69, respectively. The titanium oxide layer 68 is not an insulating layer, but it does not produce passivation problems as the film is considerably thin and the exposed area is small; it is preferable to select Ta also for the heat-resistant metal thin film layer 34A. However, please note that unlike Ti, Ta lacks the ability to absorb a surface-oxidized layer on the bed layer, making ohmic contact easier.

The second amorphous silicon layer 33A including impurities at the channel increases leak currents of insulating gate type transistors unless they are all insulated toward the thickness direction. It has been described in the prior embodiment that the use of light illumination during the execution of anode-oxidization is very important. This means that if a leak current of an insulating gate type transistor exceeds 1 μA when approximately 10,000 luxes of strong light is illuminated, current density of about 10 mA/cm2 is obtained by taking the channel area between the source-drain wires 12 and 21 and the area of the drain electrode 21 into consideration; this is necessary to obtain good film quality in anode oxidization.

Furthermore, electrical purity of the channel is raised, and complete electric isolation between the source wire 12 and the drain wire 21 is achieved by changing up to part (up to 100A or so) of a first amorphous silicon layer 31A including no impurities and being in contact with a silicon oxide layer 66 including purities, to a silicon oxide layer including no impurities (not shown); which is formed by setting up the voltage of 10 V or so higher than the 100 V or over, the chemical conversion voltage high enough to change a second amorphous silicon layer 33A including impurities to a silicon oxide layer 66, an insulating layer, through anode oxidization. In short, a high On/Off ratio is obtained when the Off-state current of the insulating gate type transistors decrease enough.

0.1-0.2 μm of film thickness would be thick enough for the oxidized layers formed through anode oxidization, alumina 69, and titanium oxide 68 layers, for the passivation of the wires, and more than 100 V of voltage is applied, using a chemical conversion solution such as ethylene glycol. Please note that all the signal lines 12 must be electrically formed (connected) either in a line or a series upon anode oxidizing the source-drain wires 12 and 21; unless the line or series is released sometime or somewhere during the following manufacturing processes, some problems would definitely arise with regard to not only the electric tests of the active substrate 2 but also the actual operation of liquid crystal display devices. Transpiration by laser light irradiation or mechanical removal by scribing is an easy way for such release; detailed description is omitted here.

After completing the anode oxidization, if photosensitive resin patterns 87C are removed, electrode terminals 5 and 6 are exposed having an anode-oxidized layer on the side and comprising a low resistance metal layer 35A as shown in FIGS. 1(f) and 2(f). However, an anode-oxidized layer is not formed on the side of the electrode terminal 5 unless 1) part of the scan lines 5A are connected to the short circuit lines 40 and 2) the electrode terminals 6 are formed containing the short circuit lines 40 as a measure against static electricity as shown in the figure. As for the structure of the source-drain wires 12 and 21, single layer such as Ta may be formed if the restrictions for the resistance value are lenient.

When a liquid crystal panel is made by attaching the active substrate 2 thus obtained and a color filter 9 together, the embodiment 1 for this invention is completed. As for the structure of the storage capacitance 15, an structural example of the storage electrode 72, which is formed at the same time as the source-drain wires 12 and 21, containing part of the pixel electrode 22 and the protruded area of the scan line 11 in the upper pixel being overlapped on a flat surface (a diagonal line going up to the right-hand side 52) through a plasma protective layer 71A and a gate insulating layer 30A as shown in FIG. 1(f). However, the structure of the storage capacitance 15 is not limited to this alone, and an insulating layer including a gate insulating layer may be formed between the pixel electrode 22 and the storage capacitance line 16 which is formed at the same time as the scan lines 11. Other structures are also possible, but detailed descriptions are omitted here.

As for measures against static electricity, a conventional example as shown in FIG. 1(f) composes the structure that 1) places short lines 40 for measures against static electricity on the periphery of the active substrate 2 and 2) connects short lines 40 to metal electrode terminals 5A and 6A with fine patterns. However, other measures against static electricity are also easily achieved since the opening formation process in the gate insulating layer 30 has been added.

When the source-drain wires 12 and 21, and the second amorphous silicon layer 33A are anode-oxidized, the exposed pixel electrodes 22 are also anode-oxidized, because they are electrically connected to the drain electrodes 21 in Embodiment 1. Therefore, depending on the film quality of the transparent conductive layer composing the pixel electrode 22, its resistance value may increase due to anode oxidization. In such a case, the film deposition conditions for transparent conductive layers need to be changed accordingly, leaving the layer as insufficient in oxygen. However, the transparency of the transparent conductive layer never decreases due to anode oxidization. Furthermore, the current necessary to anode-oxidize the drain electrode 21 and pixel electrode 22 is supplied also through the channel of the insulating gate type transistor, but a large amount of chemical conversion current or chemical conversion over a long period of time is required due to the larger pixel electrode 22 size; no matter how strongly the outside light is illuminated, it is very difficult to form anode-oxidized layers of the same film quality and thickness on the drain electrode 21 and on the storage capacitor electrode 72 as on the signal line 12 due to the resistance in the channel area, and making the chemical conversion time longer alone is not sufficient. Nevertheless, the anode-oxidized layer formed on the drain electrode 21 is often reliable enough not to cause practical problems even though it is not perfect. This is because 1) the driving signals applied to the liquid crystal cell are essentially alternating currents and 2) voltage of the opposing electrode 14 on CF 9 is adjusted (to reduce flicker) at the time of image testing in order to reduce the direct voltage components between the opposing electrode 14 and pixel electrode 22 (drain electrode 21). Thus, an insulating layer is required only on the signal lines 12 to prevent direct current components from flowing.

As mentioned above, metal electrode terminals may be obtained comprising the source-drain wire material at the formation of the source-drain wires by using half tone exposure technology. But the photo-masks for half tone exposure use are quite expensive due to the not most suitable manufacturing method currently.

Hence, by changing the pattern design for forming the signal lines 12 containing part of the transparent conductive electrode terminals 6A for the signal lines 12 without forming metal electrode terminals 5 on the transparent conductive electrode terminals 5A for the scan lines, electrode terminals 5A and 6A comprising a transparent conductive layer can be made in place of the electrode terminals 5 and 6 comprising the source-drain wire material as shown in FIG. 1(g) and 2(g). With this construction, half-tone exposure technology is not needed at the formation of the source-drain wires 12 and 21, but a care is needed in increasing the resistance values of the transparent conductive layers 5A and 6A. The construction of the device will not be altered in the image display area even if the component material for electrode terminals is changed.

As described above, process reduction is obtained at the formation of a passivation layer for source-drain wires and channels using anode-oxidization technology in Embodiment 1. There occur some problems at the latest mass-production lines against giant equipments for anode-oxidization using a prior batch treatment method because the glass substrate has a large side of 1m or more. Therefore, 4-mask process is explained as Embodiment 2 using a prior passivation insulating layer in place of anode-oxidization technology.

If an suitable insulating layer can be provided to the exposed scan lines such that direct current flow between the scan lines 11 and an opposing electrode 14 on the color filter 9 and the liquid crystal does not deteriorate, then it is possible to decrease the contact formation process by also removing the gate insulating layer to expose the scan lines when forming the semiconductor layer regions. In this case, half-tone exposure technology is not required, so photo-mask production is extremely easy.

Embodiment 2

In Embodiment 2, the process proceeds identically to Embodiment 1 until after forming the scan lines 11, pseudo-pixel electrodes 93 and pseudo-electrode terminals 94 and 95 for the scan lines and signal lines using micro-fabrication technology such as photosensitive resin patterns as shown in FIG. 3(a) and FIG. 4(a). And then deposit the protective layer 71 at approximately 0.1 μm of film thickness, furthermore successively deposit three thin film layers comprising a first SiNx layer 30 composing a gate insulating layer, a first amorphous silicon layer 31 composing a channel for an insulating gate-type transistor including hardly any impurities, and a second amorphous silicon layer 33 composing source-drain of an insulating gate-type transistor including phosphorous, for example, as an impurity are deposited 0.3, 0.2, and 0.05 μm thick, for example.

Continuingly form island shaped semiconductor layer regions comprising a laminate of the plasma protecting layer 71 in addition to the second amorphous silicon layer 33, the first amorphous silicon layer 31 and the gate insulating layer 30 on the gate electrodes 11A, near on the regions where the scan line 11 and the signal line 12 intersect, and in and around the storage capacitor formation regions on the scan lines 11, expose most of the scan lines 11, the pseudo-pixel electrodes 93, and the pseudo-electrode terminals 94 and 95 using micro-fabrication technology such as photosensitive resin patterns as shown in FIG. 3(b) and FIG. 4(b).

Sequentially deposit a thin film layer 34 of Ti, Ta or the like as a heat-resistant metal layer about 0.1 μm thick and an Al thin film layer 35 about 0.3 μm thick as a low resistance metal layer at the formation of source-drains wires. And etch these thin film layers to form drain electrodes 21 of insulating gate-type transistors containing part of the pseudo-pixel electrodes 93 and the signal lines 12 containing part of the pseudo-electrode terminals 95, both comprising a laminate of 34A and 35A using micro-fabrication technology such as photosensitive resin patterns as shown in FIG. 3(c) and FIG. 4(c), here etch the second amorphous silicon layer 33A and etch the first amorphous silicon layer 31 to leave about 0.05 to 0.1 μm as same as the prior embodiment. As for the structure of the source-drain wires 12 and 21, single layer such as Ta, Cr and MoW alloy may be formed if the restrictions for the resistance value are lenient.

After the formation of the source-drain wires 12 and 21, deposit a second SiNx layer about 0.3 μm thick as a transparent insulating layer over the entire surface of a glass substrate 2 using the PCVD equipment to make a passivation insulating layer 37 as same as 5-mask process, form openings 38, 63 and 64 on the pseudo-pixel electrodes 93 and on the pseudo-electrode terminals 94 and 95, respectively, using micro-fabrication technology such as photosensitive resin patterns as shown in FIG. 3(d) and FIG. 4(d), and remove the passivation insulating layer 37 and the first metal layers 92A to 95C on the pseudo-pixel electrodes 93 and the pseudo-electrode terminals 94 and 95 in the openings respectively, to expose the transparent conductive pixel electrodes 22 and the transparent conductive electrode terminals 5A and 6A.

The active substrate 2 thus obtained and a color filter 9 are attached together to form a liquid crystal panel, thereby completing Embodiment 2 of the present invention. As for the structure of the storage capacitance 15 as shown in FIG. 2(d), an structural example of the storage capacitor electrode 72, which is formed at the same time as the source-drain wires 12 20 and 21 containing part of the pseudo-pixel electrode 93 and the protruded area of the scan line 11 in the upper pixel being overlapped on a flat surface (a diagonal line going up to the right-hand side 52) through a plasma protective layer 71A, a gate insulating layer 30A, the first amorphous silicon layer 31B2 and the second amorphous silicon layer 33B2 (both not shown). However, the structure of the storage capacitance 15 is not limited to this alone, and an insulating layer including a gate insulating layer 30A may be formed between a pixel electrode 22 and the storage capacitance line 16 which is formed at the same time as the scan line 11.

As for measures against static electricity, a conventional example as shown in FIG. 3(d) composes the structure which 1) places short lines 40 for measures against static electricity on the periphery of the active substrate 2 and 2) connects short lines 40 to transparent conductive electrode terminals 5A and 6A with fine patterns.

The liquid crystal display devices described above use the TN-type liquid crystal cells, but the process reduction suggested in this invention is also useful in the IPS (In-Plain-Switching)-type liquid crystal display devices, which control the electric field of the side direction with a set of pixel electrode and counter electrode formed at a specific distance from each other; this will be described hereinafter.

Embodiment 3

In Embodiment 3, deposit a first metal layer of 0.1-0.3 μm in thickness, a metal with a high melting point such as Cr, Ta, Mo or the like, and an alloy or a silicide thereof, for example, on a principal plane of the glass substrate 2 using a vacuum film-depositing equipment such as the SPT, and selectively form scan lines 11 doubling as gate electrodes and storage capacitor lines 16 doubling as counter electrodes using micro-fabrication technology such as photosensitive resin patterns as shown in FIG. 5(a) and FIG. 6(a).

Next, deposit three thin film layers comprising a first SiNx layer 30 composing a gate insulating layer, a first amorphous silicon layer 31 composing a channel for an insulating gate-type transistor including hardly any impurities, and a second amorphous silicon layer 33 composing source-drain of an insulating gate-type transistor including phosphorous, for example, as an impurity are deposited 0.3, 0.2, and 0.05 μm thick, for example.

Continuingly, form island shaped semiconductor layer regions comprising a laminate of the second amorphous silicon layer 33, the first amorphous silicon layer 31 and the gate insulating layer 30 on the semiconductor layer formation regions, namely, on the gate electrodes 11A, near the regions where the scan line 11 and the signal line 12 intersect, and in and around the storage capacitor formation regions, namely, on most of the storage capacitor lines 16, near the regions where the storage capacitor line 16 and the pixel electrode 21 intersect, and expose most of the scan lines 11 and the storage capacitor lines 16 using micro-fabrication technology such as photosensitive resin patterns as shown in FIG. 5(b) and FIG. 6(b).

Sequentially, deposit a thin film layer 34 of Ti, Ta or the like as a heat-resistant metal layer about 0.1 μm thick and an Al thin film layer 35 about 0.3 μm thick as a low resistance metal layer using a vacuum film-depositing equipment such as the SPT at the formation of source-drains wires. And etch these thin film layers to form drain electrodes 21 of insulating gate-type transistors doubling as pixel electrodes and the signal lines 12 doubling as source wires, both comprising a laminate of 34A and 35A using micro-fabrication technology such as photosensitive resin patterns as shown in FIG. 5(c) and FIG. 6(c), here also etch the second amorphous silicon layer 33A and etch the first amorphous silicon layer 31 to leave about 0.05 to 0.1 μm. At this point, form electrode terminals 5 for the signal lines containing part of the signal lines 11 and electrode terminals 6 for the signal lines forming part of the signal lines 12 outside an image display area at the same as the formation of the source-drain wires 12 and 21.

But it is not necessary to form electrode terminals 5 for the signal lines here. As for the structure of the source-drain wires 12 and 21, single layer such as Ta, Cr and MoW alloy may be formed also if the restrictions for the resistance value are lenient.

After the formation of the source-drain wires 12 and 21, deposit a second SiNx layer about 0.3 μm thick is as a transparent insulating layer over the entire surface of a glass substrate 2 using the PCVD equipment to make a passivation insulating layer 37 as same as Embodiment 2, form openings 63, 64 and 65 on electrode terminals 5, 6 for the scan lines and the signal lines and on the electrode terminals (though part numeral number thereof is not given) for the storage capacitor lines 16 respectively, using micro-fabrication technology such as photosensitive resin patterns as shown in FIG. 5(d) and FIG. 6(d), and remove the passivation insulating layer in the openings to expose most of the electrode terminals 5, 6 and the electrode terminals for the storage capacitor lines 16 completing active substrate 2. Exposed part of the scan lines 11 and the storage capacitor lines 16 in the openings 63A and 65A may be made as the electrode terminals for the scan lines 11 and the storage capacitor lines 16 respectively, at the formation of the source-drain wires 12 and 21 without forming electrode terminals 5 for the scan lines and electrode terminals for the storage capacitor lines 16, both comprising the source-drain wire material.

When a liquid crystal panel is made by attaching the active substrate 2 thus obtained and a color filter 9 together, Embodiment 3 for this invention is completed. As clearly described above, the pixel electrodes 22 of transparent conductivity are not necessary on the active substrate 2, making the intermediate conductive layer 36 on the top of the source-drain wires also not necessary. As for the structure of the storage capacitance 15, an structural example of the counter electrode (storage capacitance line) 16 and the pixel electrode (drain electrode) 21 being overlapped at level (50: a diagonal line going up to the right-hand side) with the gate insulating layer 30A, the first amorphous silicon layer 31 D and the secondly amorphous silicon layer 33D (both not shown) in between as shown in FIG. 5(d), but the structure of the storage capacitance 15 is not limited to this; an insulating layer including the gate insulating layer 30A may be placed between the pixel electrode 21 and the scan line 11 in the upper pixel. Furthermore, FIG. 5(d) does not show a measure against static electricity in which a high resistance component, such as an Off-state insulating gate type transistor and long-narrow conductive line, connects the electrode terminals 5 and 6 for the scan lines and the signal lines, but measures against static electricity are easily taken as a process has been added in order to expose the scan lines 11.

Embodiment 3 uses silicon nitride (SiNx) deposited with the PCVD equipment on an active substrate 2 in the same manner as conventional embodiments, giving the merit of having fewer changes in their process at existing mass production plants and being easy to apply. However, further reduction of processes and costs is possible by adding passivation technology with anode-oxidizing the source-drain wires as shown in Embodiment 1, and this will be described as Embodiment 4.

Embodiment 4

In Embodiment 4, the process proceeds identically to Embodiment 3 until after forming island shaped semiconductor layer regions comprising a laminate of the second amorphous silicon layer 33, the first amorphous silicon layer 31 and the gate insulating layer 30 on the semiconductor layer formation regions, namely, on the gate electrodes 11A, near the regions where the scan line 11 and the signal line 12 intersect, and in and around the storage capacitor formation regions, namely, on most of the storage capacitor lines 16, near the regions where the storage capacitor line 16 and the pixel electrode 21 intersect, and expose most of the scan lines 11 and the storage capacitor lines 16 using micro-fabrication technology such as photosensitive resin patterns as shown in FIG. 7(b) and FIG. 8(b). A single layer construction of an Al (Zr, Ta, or Nd) alloy or the like with a high-heat resistance or a laminate construction of an Al/Ta, Ta/Al/Ta, Al/Al (Ta, Zr, or Nd) alloy or the like may be selected for the scan line 11 and the storage capacitor line 16 in order to form insulating layers on the side thereof through anode-oxidization. Here, Al (Ta, Zr, or Nd) means an Al alloy with high-heat resistance to which no more than a number of percent of Ta, Zr, or Nd or similar is added.

At the formation of source-drain wires, 1) deposit a) a thin film layer 34 as an anode-oxidizable heat-resistant metal layer, such as Ti and Ta, at approximately 0.1 μm in thickness and b) an AL thin film layer 35 as an anode-oxidizable low resistance wire layer at approximately 0.3 μm in thickness. Next, 2) successively etch the source-drain wire materials comprising these 2 thin film layers using fine processing technology such as photosensitive resin patterns 87A and 87B, and 3) selectively form a) pixel electrodes 21 doubling as drain electrodes for the insulating gate type transistors, and b) signal lines 12 doubling as source electrodes, both comprising a laminate of 34A and 35A, as shown in FIG. 7(c) and FIG. 8(c) as same as Embodiment 1. It is unnecessary here to etch the second amorphous silicon layer 33A including impurities and the first amorphous silicon layer 31A including no impurities.

After the formation of the source-drain wires 12 and 21, the photosensitive resin patterns 87B disappear if the said photosensitive resin patterns 87A and 87B are reduced in film thickness by 1.5 μm or more, using an ashing method such as oxygen plasma, exposing the source-drain wires 12 and 21 and storage capacitor electrodes 72, photosensitive resin patterns 87C (5) and 87C (6) can be left as they are only on the electrode terminals 5, 6. Now, 1) anode-oxidize the source-drain wires 12 and 21 while illuminating light using photosensitive resin patterns 87C (5) and 87C (6) as masks as shown in FIGS. 7(d) and 8(d), to form oxidized layers 68 and 69 and 2) at the same time, anode-oxidize the second amorphous silicon layer 33A which is exposed between the source-drain wires 12 and 21, and also 3) anode-oxidize part of the first amorphous silicon layer 31A which is adjacent to the second amorphous silicon layer 33A, to form a) a silicon oxide layer 66 including impurities, and b) a silicon oxide layer (not shown) including no impurities, both are insulating layers.

At this point, anode-oxidize the exposed scan lines 11 and counter electrodes 16 to form oxidized layers 75 on their surfaces. Anode oxidization of the counter electrodes 16 may be done easily at the same time as the anode oxidization of the scan lines 11, because extended patterns (not given their part number) to the periphery of an active substrate 2 are formed for the scan lines 11 and the counter electrodes 16 as shown in FIG. 8(d). The second amorphous silicon layers 33B to 33E, near the regions where the scan line 11 and the signal line 12 intersect, near the regions where the counter electrode 16 and the signal line 12 intersect, in and around the storage capacitor formation regions, and near the regions where the pixel electrode 21 and the counter electrode 16 intersect, are also anode-oxidized to transmute into silicon oxide layers 66 including impurities.

After completing the anode oxidization, if photosensitive resin patterns 87C are removed, electrode terminals 5 and 6 are exposed having an anode-oxidized layer on the side and comprising a low resistance metal layer 35A as shown in FIGS. 7(e) and 8(e). As for the structure of the source-drain wires 12 and 21, anode-oxidizable single layer such as Ta may be formed if the restrictions for the resistance value are lenient.

When a liquid crystal panel is made by attaching the active substrate 2 thus obtained and a color filter 9 together, the embodiment 4 for this invention is completed. The construction of the storage capacitor 15 is identical to that in Embodiment 3. Furthermore, FIG. 7(e) does not show a measure against static electricity, but a process has been added in order to expose the scan lines 11 before forming the source-drain wires 12 and 21, and it is possible to connect the electrode terminal 5 for the scan lines and the electrode terminal 6 for the signal line through a high resistance component, such as a semiconductor layer or an Off-state insulating gate type transistor, so effective measures against static electricity are easily taken.

As described above, this invention releases 4-mask process different from the prior art using channel etch type insulating transistors without the aid of half tone exposure technology. 3-mask process is obtained by applying half tone exposure technology to the layers having low pattern accuracy promoting the streamlining of the process further.

What is claimed is:

1. A liquid crystal display device in which liquid crystal is filled between a first transparent insulating substrate (active substrate) and a second transparent insulating substrate or a color filter, said second transparent insulating substrate or color filter opposing said first transparent insulating substrate, wherein said first transparent insulating substrate has at least one unit pixel having at least one insulating gate-type transistor, a scan line doubling as a gate electrode and a signal line doubling as a source wire of said insulating gate-type transistor, and a pixel electrode connected to a drain wire on a main surface arranged in a two-dimensional matrix, comprising:

a scan line and another scan line, each comprising a laminate of a transparent conductive layer and a first metal layer, and a transparent conductive pixel electrode, both formed on a main surface of the first transparent insulating substrate;

a first semiconductor layer including no impurities formed in an island shape wider than the gate electrode through a plasma protecting layer and a gate insulating layer above the gate electrode;

a pair of second semiconductor layers including impurities and composing source-drain for an insulating the gate transistor formed on said first semiconductor layer such that a part of said second semiconductor layers overlaps the gate electrode and another part of the second semiconductor layers overlaps a part of the another scan line to form a capacitor;

an opening formed in the plasma protecting layer and the gate insulating layer on said pixel electrode, on part of the scan line, to expose said pixel electrode and transparent conductive layer forming part of the scan line;

a signal line and another signal line formed on said second semiconductor layer and on the gate insulating layer, and a drain wire formed on the second semiconductor layer, on the gate insulating layer and on part of the pixel electrode, both comprising a second anodizable metal layer of one or more metal layers including a heat resistant metal layer, and an electrode terminal for the signal line composing part of the signal line formed outside an image display region, wherein the another part of the second semiconductor layers does not overlap the another signal line;

an anodized layer formed on the source-drain wire except on the electrode terminal for said signal line; and an oxide layer formed on the first semiconductor layer between the source-drain wire.

2. The liquid crystal display device according to claim 1, further comprising a transparent electrode terminal for the signal line formed on a main surface of the first transparent insulating substrate.

3. The liquid crystal display device according to claim 1, wherein said opening is further formed on the electrode terminal for the signal line to expose a transparent electrode terminal for the signal line.

4. The liquid crystal display device according to claim 1, wherein said signal line is formed on part of the transparent conductive electrode terminal for the signal line.

5. The liquid crystal display device according to claim 1, wherein said second semiconductor layer is silicon and said oxide layer is silicon oxide.

6. The liquid crystal display device according to claim 1, further comprising a capacitor electrode formed on the part of the second semiconductor layers.

7. A manufacturing method for a liquid crystal display device in which liquid crystal is filled between a first transparent insulating substrate (active substrate) and a second transparent insulating substrate or a color filter, said second transparent insulating substrate or color filter opposing said first transparent insulating substrate, wherein said first transparent insulating substrate has a unit pixel having at least an insulating gate-type transistor, a scan line doubling as a gate electrode and a signal line doubling as a source wire of said insulating gate-type transistor, and a pixel electrode connected to a drain wire on a main surface arranged in a two-dimensional matrix, comprising the steps of:

forming a scan line, a pseudo electrode terminal for the scan line and being part of the scan line, and a pseudo pixel electrode, all comprising a laminate of a transparent conductive layer and a first metal layer on a main surface of the first transparent insulating substrate;

successively depositing a plasma protecting layer, a gate insulating layer, a first amorphous silicon layer including no impurities, and a second amorphous silicon layer including impurities;

forming a laminate of the second amorphous silicon layer and the first amorphous silicon layer in an island shape wider than the gate electrode and above the gate electrode to expose said gate insulating layer;

forming an opening in the gate insulating layer and the plasma protecting layer above the scan line, and the pseudo-pixel electrode, and for removing the first metal layer in said opening to expose a transparent conductive part of the scan line, and a transparent conductive part of the pixel electrode;

depositing an anodizable second metal layer of one or more layers including a heat resistant metal, and then forming a source wire (signal line) on the second semiconductor layer and on the gate insulating layer, a drain wire on the second semiconductor layer on the gate insulating layer and on part of the pixel electrode within said opening, electrode terminal for the scan line containing part of said scan line, and electrode terminal for the signal line forming part of the signal line, wherein a photosensitive resin remains on said electrode terminal after using a halftone exposure process and an ashing process; and anodizing the source-drain wire and amorphous silicon layer between the source-drain wire while protecting said electrode terminal.

8. The method according to claim 7, further comprises forming a pseudo electrode terminal for the signal line on a main surface of the first transparent insulating substrate.

9. The method according to claim 8, further comprises forming an opening on a pseudo electrode terminal for the signal line to expose the transparent electrode terminal for the signal line.

10. The method according to claim 7, further comprises forming said signal line on a part of the transparent conductive electrode terminal for the signal line.

* * * * *